(12) United States Patent
Okamoto et al.

(10) Patent No.: US 12,205,972 B2
(45) Date of Patent: Jan. 21, 2025

(54) OPTICAL DEVICE, PHOTOELECTRIC CONVERTER, AND FUEL GENERATOR

(71) Applicant: Panasonic Intellectual Property Management Co., Ltd., Osaka (JP)

(72) Inventors: Shinya Okamoto, Kyoto (JP); Yasuhisa Inada, Osaka (JP); Atsushi Ishikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 147 days.

(21) Appl. No.: 17/460,398

(22) Filed: Aug. 30, 2021

(65) Prior Publication Data

US 2021/0391373 A1     Dec. 16, 2021

Related U.S. Application Data

(63) Continuation of application No. PCT/JP2020/002661, filed on Jan. 27, 2020.

(30) Foreign Application Priority Data

Mar. 29, 2019  (JP) ................. 2019-068292

(51) Int. Cl.
*H01L 27/146*    (2006.01)
*H01L 31/0232*   (2014.01)
*H01L 31/108*    (2006.01)
*H02S 10/30*     (2014.01)

(52) U.S. Cl.
CPC ........... *H01L 27/14649* (2013.01); *H01L 27/14625* (2013.01); *H01L 31/0232* (2013.01); *H01L 31/108* (2013.01); *H02S 10/30* (2014.12)

(58) Field of Classification Search
None
See application file for complete search history.

(56) References Cited

U.S. PATENT DOCUMENTS

2009/0008735 A1    1/2009  Ogino et al.
2009/0134486 A1*   5/2009  Fujikata .......... H01L 31/022408
                                                       257/E31.093
2011/0272771 A1   11/2011  Briceno
(Continued)

FOREIGN PATENT DOCUMENTS

CN    109473487 A  *  3/2019  ............. B82Y 30/00
CN    208655701 U  *  3/2019
(Continued)

OTHER PUBLICATIONS

English machine translation of Lu et al. (CN-109473487-A) provided by the EPO website, All Pages, 2023. (Year: 2023).*
(Continued)

*Primary Examiner* — Daniel P Malley, Jr.
(74) *Attorney, Agent, or Firm* — Rimon P.C.

(57) ABSTRACT

An optical device includes a nanostructure body which induces surface plasmon resonance when irradiated with light, an oxide layer which is in contact with the nanostructure body, an alloy layer which is in contact with the oxide layer and which is made of an alloy containing a first metal and a second metal that are different in work function from each other, and an n-type semiconductor which is in Schottky contact with the alloy layer.

28 Claims, 13 Drawing Sheets

(56) References Cited

U.S. PATENT DOCUMENTS

| | | | | |
|---|---|---|---|---|
| 2012/0285517 A1* | 11/2012 | Souza | ............... | H01L 31/07 |
| | | | | 136/255 |
| 2013/0126886 A1* | 5/2013 | Brown | ............... | H01L 29/872 |
| | | | | 257/191 |
| 2014/0318596 A1* | 10/2014 | Juluri | ............... | H01L 31/022466 |
| | | | | 136/255 |
| 2015/0034160 A1* | 2/2015 | Wu | ............... | H01L 31/0445 |
| | | | | 136/265 |
| 2017/0276547 A1* | 9/2017 | Hoang | ............... | G01J 3/021 |
| 2019/0074396 A1 | 3/2019 | Dong et al. | | |

FOREIGN PATENT DOCUMENTS

| | | |
|---|---|---|
| JP | 2009-038352 | 2/2009 |
| JP | 2013-106025 | 5/2013 |
| JP | 2013-115417 A | 6/2013 |
| JP | 2014-067988 | 4/2014 |
| JP | 2015-078904 | 4/2015 |
| JP | 2016-162890 | 9/2016 |
| JP | 2017-028243 | 2/2017 |
| JP | 2019-047016 A | 3/2019 |
| WO | 2007/105593 A1 | 9/2007 |
| WO | 2010/067398 | 6/2010 |
| WO | 2011/152459 A1 | 12/2011 |

OTHER PUBLICATIONS

English machine translation of Zhongshan (CN-208655701-U) provided by the EPO website, 2024, All Pages. (Year: 2024).*
International Search Report of PCT application No. PCT/JP2020/002661 dated Mar. 24, 2020.
Mark W. Knight et al., "Photodetection with Active Optical Antennas", Science, vol. 332, May 6, 2011, pp. 702-704.

* cited by examiner

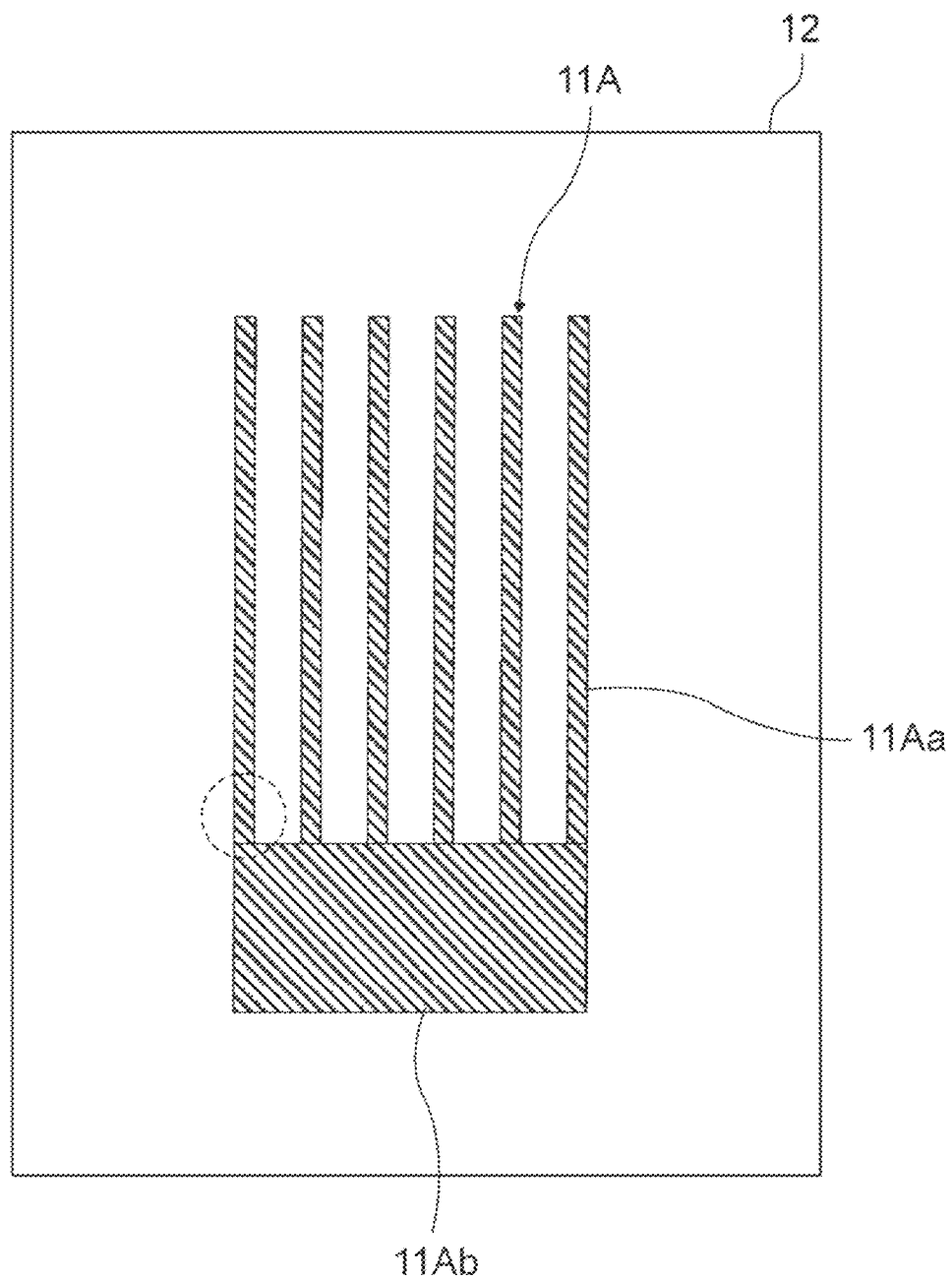

OPTICAL DEVICE, PHOTOELECTRIC CONVERTER, AND FUEL GENERATOR

BACKGROUND

1. Technical Field

The present disclosure relates to relates to an optical device, a photoelectric converter, and a fuel generator.

2. Description of the Related Art

Photoelectric conversion technology using surface plasmon resonance in a Schottky structure in which a metal nanostructure body is disposed on a semiconductor is attracting attention. Electrons are temporarily excited by surface plasmon resonance are called hot electrons. Hot electrons surmount a Schottky barrier between a metal and a semiconductor, whereby charges are separated and photoelectric conversion is achieved. An element in which a metal nanostructure body is disposed on a semiconductor is also attracting attention in the field of photocatalysts.

Japanese Unexamined Patent Application Publication No. 2016-162890 (hereinafter referred to as Patent Document 1) and Japanese Unexamined Patent Application Publication No. 2014-67988 (hereinafter referred to as Patent Document 2) disclose an example of a photoelectric conversion method using an element in which metal nanoparticles having surface plasmon resonance absorption properties are disposed on an n-type semiconductor.

Mark W. Knight, Heidar Sobhani, Peter Nordlander, and Naomi J. Halas, "Photodetection with Active Optical Antennas", Science, 2011, vol. 332, pp. 702-704 (hereinafter referred to as Non-Patent Document 1) discloses a photoelectric conversion method using a Schottky element in which a metal film having a low work function and a metal film having surface plasmon resonance absorption properties are disposed on an n-type semiconductor.

SUMMARY

One non-limiting and exemplary embodiment provides an optical device with enhanced photoelectric conversion efficiency.

In one general aspect, the techniques disclosed here feature an optical device including a nanostructure body which induces surface plasmon resonance when irradiated with light, an oxide layer which is in contact with the nanostructure body, an alloy layer which is in contact with the oxide layer and which is made of an alloy containing a first metal and a second metal that are different in work function from each other, and an n-type semiconductor which is in Schottky contact with the alloy layer.

It should be noted that general or specific embodiments of the present disclosure may be implemented as a device, an apparatus, a system, a method, or any selective combination thereof.

According to an embodiment of the present disclosure, the photoelectric conversion efficiency can be enhanced.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2C is a top view of an example of a Schottky device including a nanostructure body having a comb-shaped structure;

DETAILED DESCRIPTION

Figure 1A:
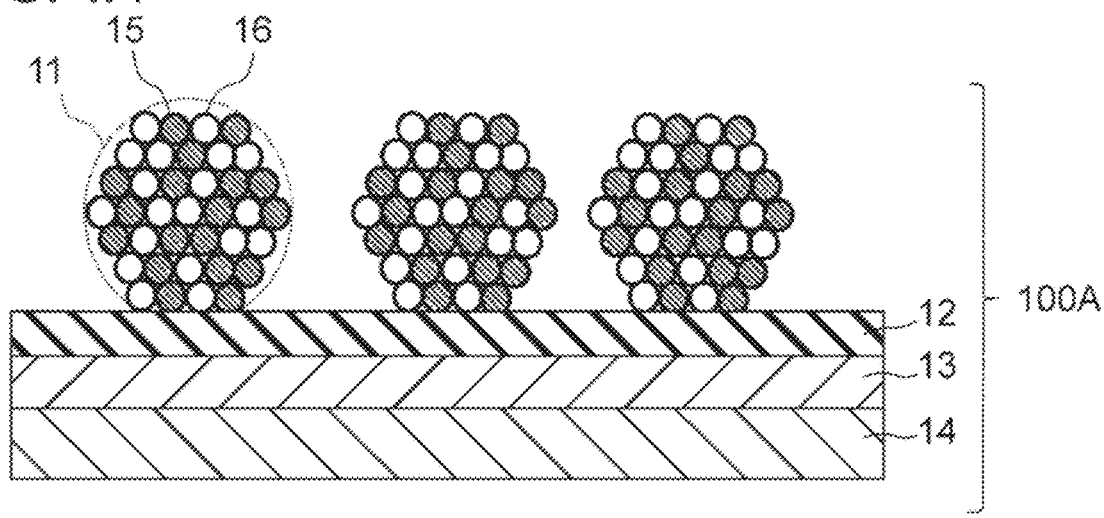
FIG. 1A is a schematic view of an example of a Schottky device according to an embodiment of the present disclosure.

Before embodiments of the present disclosure are described, knowledge found by the inventors is described.

Semiconductor photodetectors widely used at present use photoelectric conversion based on light absorption due to interband transition. Therefore, the semiconductor photodetectors cannot detect light with an energy lower than the band gap energy of a semiconductor. It is expected to achieve photoelectric conversion in a wavelength region wider than that used in conventional semiconductor photodetectors.

It is expected to achieve a photodetector capable of detecting, for example, light in the near-infrared region (hereinafter referred to as "near-infrared light") with high sensitivity at low cost. Using near-infrared light enables high-sensitivity imaging night and day. Furthermore, near-infrared light is highly safe for eyes. Therefore, photodetectors in the near-infrared region are expected to be used in sensors for self-driving cars.

For visible light, silicon (Si) photodetectors are relatively inexpensive and are widely used. However, near-infrared light has a lower energy than visible light and therefore cannot be detected without using a semiconductor with lower band gap energy. Semiconductors with low band gap energy include, for example, indium gallium arsenide (InGaAs).

On the other hand, a photoelectric conversion technique including a Schottky structure in which a metal nanostructure body is disposed on a semiconductor as disclosed in Patent Documents 1 and 2 is attracting attention. Hot electrons generated by surface plasmon resonance in the metal nanostructure body surmount a Schottky barrier, whereby charges are separated and photoelectric conversion is achieved. This technique can use light in a wide wavelength region, including long-wavelength light which has been difficult to use, and is therefore attracting attention in the field of not only photoelectric conversion but also photocatalysts.

In the metal nanostructure body, for example, a metal, such as gold (Au), having excellent plasmonic characteristics can be used. However, the metal having excellent plasmonic characteristics has a high work function and therefore a Schottky barrier formed at the interface between the semiconductor and the metal is high. Therefore, hot electrons are unlikely to surmount the Schottky barrier.

In Non-Patent Document 1, the following improvement is made: a Schottky barrier is reduced by providing titanium (Ti), which is a metal with a relatively low work function, between a semiconductor substrate and Au, which is a metal with excellent plasmonic characteristics.

In the technique of Non-Patent Document 1, a Ti film has low plasmonic characteristics. Therefore, plasmon absorption characteristics of a metal nanostructure body on the semiconductor substrate decrease and the sensitivity and the photoelectric conversion efficiency decrease.

The inventors have found the above problem and have devised a novel optical device for solving the problem. A summary of an embodiment of the present disclosure is described below.

An optical device according to an embodiment of the present disclosure includes a nanostructure body which induces surface plasmon resonance when irradiated with light, an oxide layer which is in contact with the nanostructure body, an alloy layer which is in contact with the oxide layer and which is made of an alloy containing a first metal and a second metal that are different in work function from each other, and an n-type semiconductor which is in Schottky contact with the alloy layer.

The alloy layer can be formed using an alloy having a lower work function than the nanostructure body. This reduces a Schottky barrier and enables the transport efficiency of hot electrons to be enhanced as compared to a configuration in which the n-type semiconductor is in contact with the nanostructure body.

The nanostructure body may be made of, for example, at least one selected from the group consisting of the first metal alone, an intermetallic compound containing the first metal and the second metal, a solid-solution alloy containing the first metal and the second metal, conductive oxides, and metal nitrides.

The term "intermetallic compound or solid-solution alloy of the first metal and the second metal" as used herein refers to an intermetallic compound or solid-solution alloy mainly containing the first metal and the second metal. The intermetallic compound or the solid-solution alloy may contain an element other than the first metal and the second metal, for example, an impurity. As the second metal, a metal having a lower work function than the first metal can be selected.

The first metal may be, for example, a metal having excellent plasmonic characteristics and low ionization tendency. In this case, the alloy layer, which contains a metal with a lower work function than the first metal, may be disposed between the nanostructure body, which contains the first metal, and the n-type semiconductor. This enables the generation of hot electrons at high efficiency and the draw of a current by a low Schottky barrier to be both achieved. Furthermore, the oxide layer is interposed between the nanostructure body and the alloy layer, whereby the oxidation of the alloy layer is suppressed. This enables the photoelectric conversion efficiency to be enhanced.

The nanostructure body may be made of a conductive oxide or a metal nitride. The nanostructure body may contain, for example, at least one conductive oxide selected from the group consisting of tin-doped indium oxide (ITO), aluminium-doped zinc oxide (AZO), and gallium-doped zinc oxide (GZO). Alternatively, the nanostructure body may contain, for example, at least one metal nitride selected from the group consisting of titanium nitride (TiN), zirconium nitride (ZrN), tantalum nitride (TaN), and hafnium nitride (HfN). Even in the case of using the nanostructure body containing at least one of these conductive oxides or metal nitrides, hot electrons can be generated at high efficiency.

Exemplary embodiments of the present disclosure are described below with reference to the attached drawings. Incidentally, unnecessarily detailed descriptions are omitted in some cases. For example, a detailed description of a well-known matter is omitted in some cases. Substantially the same components are given the same reference numerals and overlapping descriptions are omitted in some cases. This is to avoid unnecessary redundancy in descriptions below and to facilitate understanding by those skilled in the art. The inventors provide the attached drawings and the descriptions below to help those skilled in the art to sufficiently understand the present disclosure. The attached drawings and the descriptions below are not intended to limit the subject matters described in the claims.

First Embodiment: Schottky Device

An embodiment of a Schottky device is described as an example of the optical device.

FIG. 1A is a schematic view of an example of a Schottky device 100A according to an exemplary embodiment of the present disclosure. The Schottky device 100A includes a plurality of alloy nanoparticles 11 which are nanostructure bodies, an oxide layer 12, an alloy layer 13, and an n-type semiconductor 14. The alloy nanoparticles 11 are in contact with the oxide layer 12. The alloy layer 13 is in contact with a substrate made of the n-type semiconductor 14 and has an upper section covered by the oxide layer 12.

As shown in FIG. 1A, the alloy layer 13 has a uniform filmy structure. The alloy layer 13 is not limited to such a structure and may have, for example, a patchy structure. In this case, the oxide layer 12 may be in contact with the n-type semiconductor 14.

The alloy nanoparticles 11 contain a first metal 15 and a second metal 16. The first metal 15 has excellent plasmonic characteristics and low ionization tendency. The second metal 16 has a lower work function than the first metal 15. The alloy layer 13 contains the first metal 15 and the second metal 16. In this embodiment, the alloy nanoparticles 11 and the alloy layer 13 are both made of an alloy of the first metal 15 and the second metal 16. The alloy nanoparticles 11 and the alloy layer 13 may be different in composition. The alloy layer 13 has a lower work function than the alloy nanoparticles 11.

According to the above configuration, the alloy layer 13 and the n-type semiconductor 14 are joined together with a large area. This allows the reduction of a Schottky barrier and the enhancement of the transport efficiency of hot electrons to be achieved. The oxide layer 12 forms nanogaps between the alloy nanoparticles 11 and the alloy layer 13. This enhances the efficiency of generating hot electrons in the vicinity of a surface of the n-type semiconductor 14 because of a resonance effect. Furthermore, the natural oxidation of the alloy layer 13 can be suppressed with the oxide layer 12. Therefore, an optical device enabling photoelectric conversion at high efficiency can be achieved at relatively low cost.

Components are further described below in detail.

The first metal 15 may be composed of a material having high conductivity, excellent plasmonic characteristics, and low ionization tendency. The first metal 15 may be, for example, one or more metals selected from the group consisting of gold (Au), silver (Ag), copper (Cu), palladium (Pd), and aluminium (Al).

The second metal 16 may be composed of a material having a lower work function than the first metal 15. The second metal 16 may be, for example, one or more metals selected from the group consisting of titanium (Ti), chromium (Cr), silver (Ag), copper (Cu), aluminium (Al), nickel (Ni), manganese (Mn), iron (Fe), zinc (Zn), gallium (Ga), and tantalum (Ta).

The first metal 15 may be a metal with a lower electrical resistance than the second metal 16.

The alloy nanoparticles 11 have surface plasmon resonance absorption properties. The surface plasmon resonance wavelength of the alloy nanoparticles 11 can be adjusted by varying the particle diameter, shape, and structure of the alloy nanoparticles 11 and the composition of an alloy.

In the present disclosure, the term "particle diameter" refers to the diameter of a circle circumscribed around a particle in a microscopic image including an image of the particle. The particle diameter is hereinafter referred to as the "size" in some cases. In the present disclosure, the term "nanoparticle" refers to a particle with a size which is sufficiently less than the wavelength of light used (typically visible light or near-infrared light) and which is on the order of nanometers (nm). That is, the term "nanoparticle" refers to a particle with a particle diameter of greater than or equal to about 1 nm and less than about 1 μm. The size of the alloy nanoparticles 11 may be, for example, greater than or equal to 1 nm and less than or equal to 200 nm. The size of the alloy nanoparticles 11 may be greater than or equal to 1 nm and less than or equal to 50 nm in an example or may be greater than or equal to 5 nm and less than or equal to 20 nm in another example. Setting the size of the alloy nanoparticles 11 to less than or equal to 200 nm enables plasmon absorption to be enhanced. For example, a microscopic image including images of at least 10 of the alloy nanoparticles 11 is obtained and the arithmetic average of the sizes of the 10 alloy nanoparticles 11 may be determined on the basis of the microscopic image. The arithmetic average may be greater than or equal to 1 nm and less than or equal to 200 nm, may be greater than or equal to 1 nm and less than or equal to 50 nm, or may be greater than or equal to 5 nm and less than or equal to 20 nm. The size of the alloy nanoparticles 11 can be measured using, for example, an electron microscope such as a transmission electron microscope (TEM) or a scanning electron microscope (SEM).

The alloy nanoparticles 11 may have, for example, various structures or shapes such as a core-shell structure below, a wire structure which is long in a certain direction, and a cube structure which has a shape close to a cube in addition to a spherical structure shown in FIG. 1A. An example in which the alloy nanoparticles 11 are used is described below. The form of an alloy is not limited to a nanoparticle. For example, an alloy nanostructure body 11A which is composed of the same material as that of the alloy nanoparticles 11 and which has a comb-shaped structure may be disposed in contact with the oxide layer 12 instead of the alloy nanoparticles 11 as described below with reference to FIG. 2C. In an example shown in FIG. 1A, the whole of the alloy nanoparticles 11 is composed of an alloy of the first metal 15 and the second metal 16. However, only a portion of each alloy nanoparticle 11 may be made of an alloy containing the first metal 15 and the second metal 16 like, for example, a core-shell structure described below with reference to FIG. 1C.

In the example shown in FIG. 1A, the alloy nanoparticles 11 are made of an intermetallic compound of the first metal 15 and the second metal 16 or a solid-solution alloy of the first metal 15 and the second metal 16.

The term "intermetallic compound" refers to a compound in which two or more metals are combined at a simple integer ratio and also refers to an alloy in which atoms are regularly arranged over a relatively long distance (for example, 1 nm or more) in an orderly manner. The term "solid-solution alloy" refers to a single-phase alloy in which a plurality of metal elements are uniformly and disorderly distributed in a crystal and which has a structure in which the structure of any one of the metals is maintained and another metal has entered or has substituted.

Whether a particle is made of an alloy can be confirmed by elemental mapping using, for example, a scanning transmission electron microscope (STEM). If the particle is unseparated into phases of a plurality of metal elements which are components thereof, the particle can be determined to be made of an alloy. In particular, if the particle meets Conditions (1) and (2) below, the particle can be said to be made of an alloy of the first metal 15 and the second metal 16. (1) When the particle is measured by elemental mapping at a resolution of 1 nm×1 nm using a STEM, the first metal 15 and the second metal 16 are detected in 80% or more of all region occupied by the particle. (2) The first metal 15 and the second metal 16 are detected in a cross section of the particle at a ratio reflecting the composition ratio by energy dispersive X-ray analysis (EDX) and line analysis.

Whether a particle is made of a solid-solution alloy can be confirmed on the basis of, for example, a diffraction pattern obtained by X-ray diffractometry. If a peak shift, reflecting the composition ratio on the basis of Vegard's law, from the peak position of each of the first metal 15 alone and the second metal 16 alone is observed in the diffraction pattern, the particle can be determined to be made of a solid-solution alloy of the first metal 15 and the second metal 16.

On the other hand, whether a particle is made of an intermetallic compound can be confirmed by, for example, electron diffractometry or X-ray diffractometry. If a diffraction pattern obtained by electron diffractometry or X-ray diffractometry coincides with a diffraction pattern of an intermetallic compound of the first metal 15 and the second metal 16 that is disclosed in a document such as a specialized book, the particle can be determined to be made of the intermetallic compound of the first metal 15 and the second metal 16.

When the composition ratio of an intermetallic compound is different from a composition ratio disclosed in a document, a slight shift in spacing between diffraction spots (in the case of X-ray diffraction, peaks) is sometimes found depending on a shift in interplanar spacing. In this case, lattice spacing is determined from a lattice image obtained by the structural analysis of a particle using a STEM and whether the intermetallic compound is contained may be determined on the basis of whether a peak position calculated from the lattice spacing coincides with a peak position disclosed in a document. Alternatively, the composition ratio of a particle is determined by EDX, lattice spacing is calculated using Vegard's law, and whether the intermetallic compound is contained may be determined on the basis of whether a peak position calculated from the lattice spacing coincides with a peak position disclosed in a document.

A solid solution containing the first metal 15 and the second metal 16 may contain another metal. The composition ratio between the first metal 15 and the second metal 16 in an alloy portion that is in a solid-solution state may be appropriately adjusted depending on necessary characteristics. In this embodiment, the alloy nanoparticles 11 contain a larger amount of the first metal 15 than the second metal 16. That is, the amount of substance of the first metal 15 contained in the alloy nanoparticles 11 is larger than the amount of substance of the second metal 16 contained in the alloy nanoparticles 11. In another embodiment, the alloy nanoparticles 11 may contain a larger amount of the second metal 16 than the first metal 15. In a description below, the first metal 15 is a solvent metal and the second metal 16 is a solute metal.

Properties of the solvent metal, which accounts for a large proportion, that is, the first metal 15, are primarily reflected in plasmonic characteristics of the alloy nanoparticles 11. On the other hand, a Schottky barrier is reduced due to the solute metal, which has a low work function, that is, the second metal 16, thereby enabling the efficiency of drawing a current to be enhanced. This enables a dramatic improvement in performance to be achieved in comparison with a case where no second metal 16 is present.

The electron affinity of the n-type semiconductor 14 is lower than the work function of a third metal in the alloy layer 13 and a Schottky junction is established between the n-type semiconductor 14 and the alloy layer 13. This allows the Schottky device 100A to exhibit rectification characteristics.

The wavelength corresponding to the band gap energy of the n-type semiconductor 14 may be shorter than the surface plasmon resonance wavelength of the alloy nanoparticles 11. In other words, the energy of light causing surface plasmon resonance in the alloy nanoparticles 11, that is, the energy of irradiation light, may be lower than the band gap energy of the n-type semiconductor 14. Even when the energy of irradiation light is lower than the band gap energy of the n-type semiconductor 14, if generated hot electrons surmount a Schottky barrier, charges are separated.

The n-type semiconductor 14 may include, for example, at least one selected from the group consisting of silicon (Si) semiconductors, germanium (Ge) semiconductors, and gallium arsenide (GaAs) semiconductors. The n-type semiconductor 14 may be a Si semiconductor, a Ge semiconductor, or a GaAs semiconductor. In this case, the surface plasmon resonance wavelength of the alloy nanoparticles 11 may be, for example, greater than or equal to 900 nm. The n-type semiconductor 14 may be a wide-gap semiconductor. The wide-gap semiconductor may include at least one selected from the group consisting of titanium oxide ($TiO_2$) semiconductors, gallium nitride (GaN) semiconductors, and strontium titanate ($SrTiO_3$) semiconductors. The wide-gap semiconductor may be a titanium oxide ($TiO_2$) semiconductor, a gallium nitride (GaN) semiconductor, or a strontium titanate ($SrTiO_3$) semiconductor. When the n-type semiconductor 14 is the wide-gap semiconductor, the surface plasmon resonance wavelength of the alloy nanoparticles 11 may be, for example, greater than or equal to 400 nm. As described above, the n-type semiconductor 14 may be, for example, an inorganic semiconductor.

Hitherto, for light with a wavelength of 900 nm or less, Si semiconductors for which a technique for preparing a high-quality crystal has been established have been used, thereby achieving high-sensitivity light detection. For near-infrared light with an energy lower than the band gap energy of the Si semiconductors, InGaAs semiconductors epitaxially grown on InP single-crystal substrates have been used, thereby achieving high sensitivity. However, an advanced thin film-forming technique is necessary to prepare the InGaAs semiconductors. According to this embodiment, even in the case of using the Si semiconductor, the Ge semiconductor, the GaAs semiconductor, or the wide-gap semiconductor, light in the near-infrared region can be detected. No advanced thin film-forming technique is necessary to prepare these semiconductors and therefore these semiconductors enable cost reduction. In particular, in the case of using the Si semiconductor, the dark current can be reduced in comparison with the InGaAs semiconductors.

Hitherto, a structure in which a metal film with a low work function is disposed between an n-type semiconductor substrate and a metal which causes surface plasmon resonance as disclosed in Non-Patent Document 1 has been known. However, no attempt has been made to alloy the first metal 15, which causes surface plasmon resonance, and the second metal 16, which has a low work function, as described in this embodiment. Using a structure described in this embodiment enables a photoelectric conversion device with high efficiency to be prepared by a simple method such as a nanoink application process.

The alloy layer 13 may be made of an alloy of the first metal 15 and the second metal 16 or an alloy of other types of metals. The alloy layer 13 may be secondarily formed by, for example, a process for applying the alloy nanoparticles 11 to the substrate of the n-type semiconductor 14. On this occasion, the oxide layer 12 may be formed in such a manner that a portion of the n-type semiconductor 14 is diffused and combines with oxygen. In this case, the oxide layer 12 can be formed from, for example, an oxide of an element forming the n-type semiconductor 14, such as silicon dioxide ($SiO_2$). The oxide layer 12 may be formed from an oxide of an element not forming the n-type semiconductor 14.

Figure 1B:
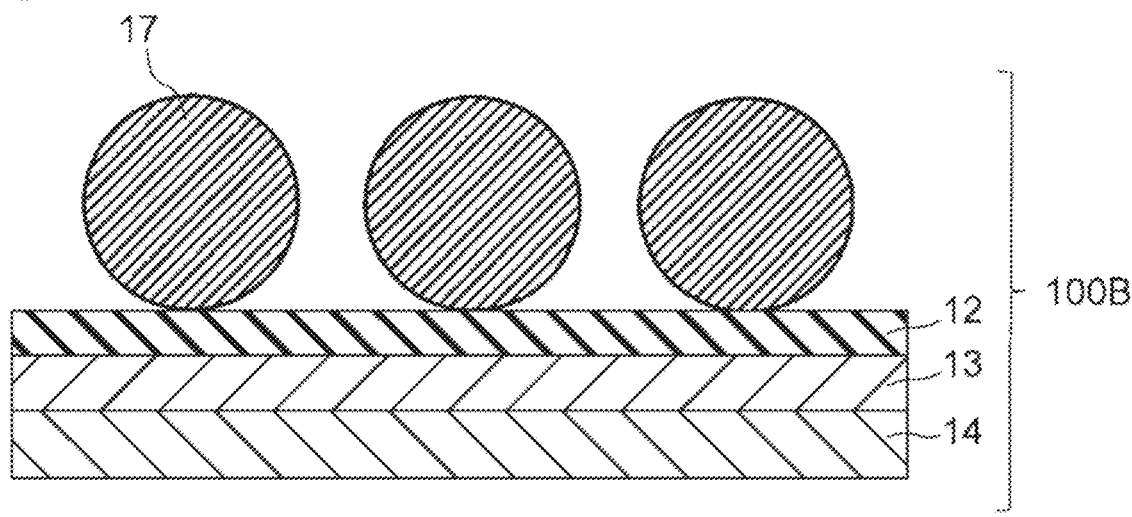
FIG. 1B is a schematic view of a Schottky device according to a modification.

FIG. 1B is a schematic view of a Schottky device 100B according to a modification of this embodiment. In this modification, the Schottky device 100B differs from a configuration shown in FIG. 1A in that nanoparticles composed of an elemental metal 17 are disposed on an oxide layer 12. The elemental metal 17 is a first metal. According to a configuration shown in FIG. 1B, the efficiency of plasmon absorption is high and the photoelectric conversion efficiency can be enhanced.

Figure 1C:
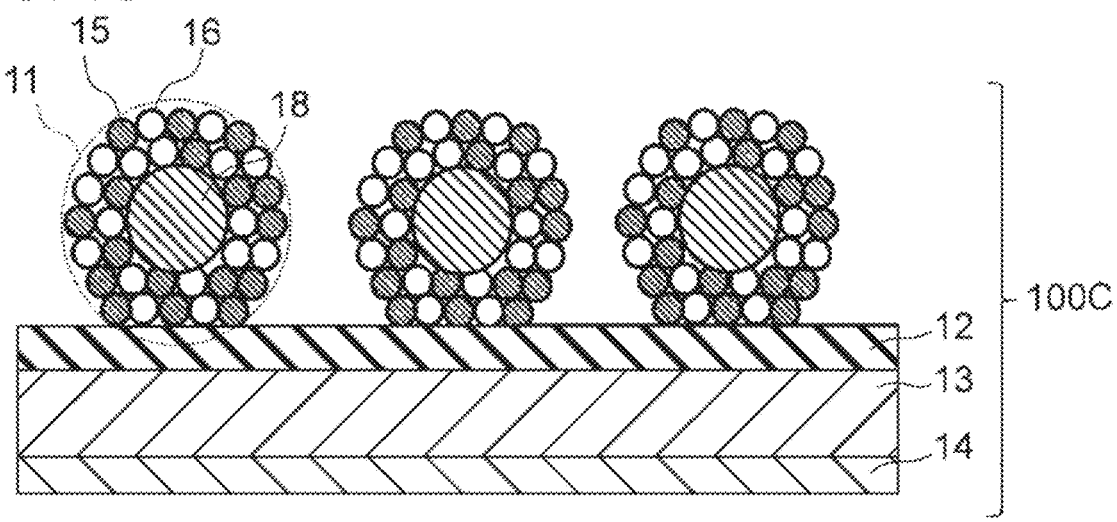
FIG. 1C is a schematic view of a Schottky device according to another modification.

FIG. 1C is a schematic view of a Schottky device 100C according to another modification of this embodiment. The Schottky device 100C differs from the configuration shown in FIG. 1A in that the Schottky device 100C includes alloy nanoparticles 11 with a core-shell structure. In this modification, the alloy nanoparticles 11 each include a core section 18 and an alloy section covering at least a portion of the periphery of the core section 18. The core section 18 may be composed of, for example, at least one material selected from the group consisting of the first metal 15, polymer materials, silica, and air. The alloy section is composed of the first metal 15 and the second metal 16 and covers a portion or the whole of the periphery of the core section 18.

The core section 18 may consist essentially of gold (Au), silver (Ag), copper (Cu), aluminium (Al), palladium (Pd), a polymer material, or silica. When the core section 18 is composed of Au, Ag, Cu, Al, or Pd, the core section 18 is not significantly affected by alloying and therefore can have intrinsic high plasmonic characteristics. The core section 18 may be made of a polymer material such as polystyrene or silica or may be a cavity. In this case, the surface plasmon resonance wavelength can be shifted to a longer wavelength by the interaction between the core section 18, which is an inner shell of the core-shell structure, and surface plasmon in the alloy section, which is an outer shell of the core-shell structure.

Figure 1D:
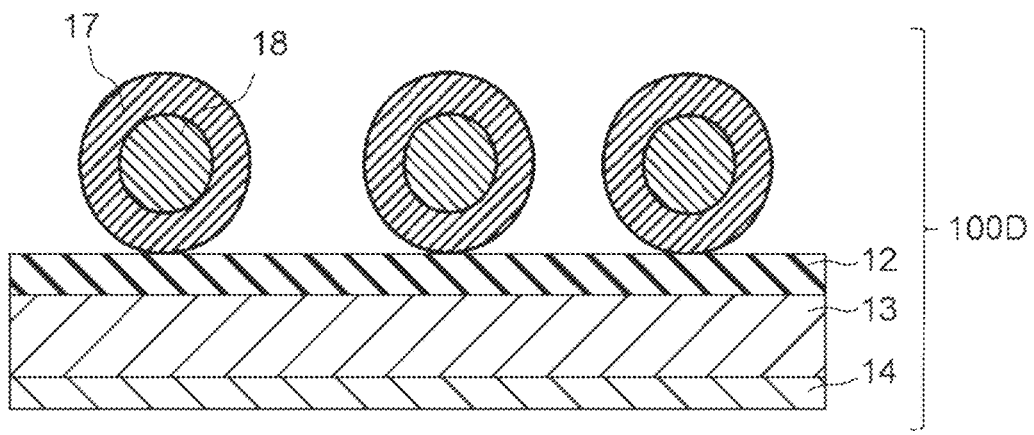
FIG. 1D is a schematic view of a Schottky device according to still another modification.

FIG. 1D is a schematic view of a Schottky device 100D according to still another modification of this embodiment. In this modification, the Schottky device 100D differs from a configuration shown in FIG. 1C in that an elemental metal 17 covers the periphery of each core section 18. The elemental metal 17 is a first metal. According to a configuration shown in FIG. 1D, the efficiency of plasmon absorption is high and the photoelectric conversion efficiency can be enhanced.

Figure 1E:
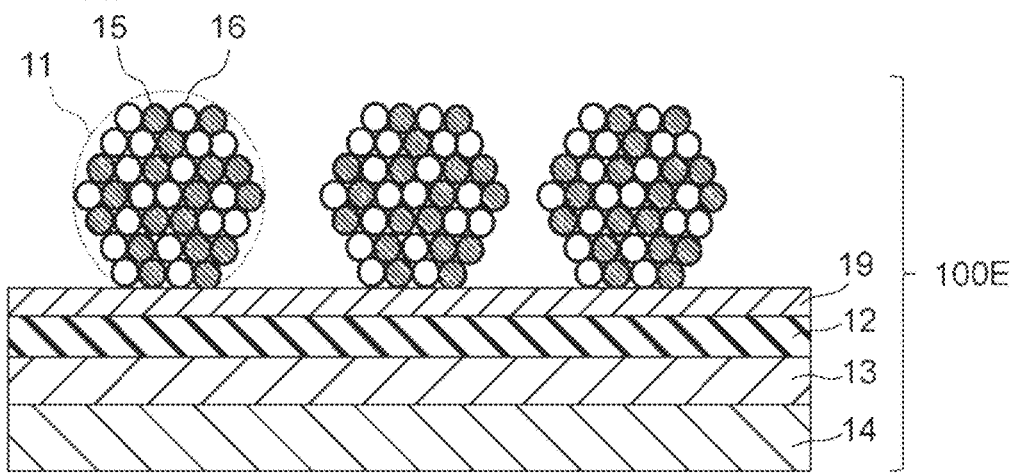
FIG. 1E is a schematic view of a Schottky device according to still another modification.

FIG. 1E is a schematic view of a Schottky device 100E according to still another modification of this embodiment. The Schottky device 100E further includes a metal film 19 that physically and electrically connects a plurality of alloy nanoparticles 11 in addition to the structure shown in FIG. 1A. In this modification, the metal film 19 may be composed of a metal with low electrical resistance. The metal film 19 may be composed of either an elemental metal or an alloy. The metal film 19 covers at least a portion of a surface of an oxide layer 12. In other words, the metal film 19 need not cover the whole of the oxide layer 12 and a portion of the oxide layer 12 may be exposed.

Figure 3A:
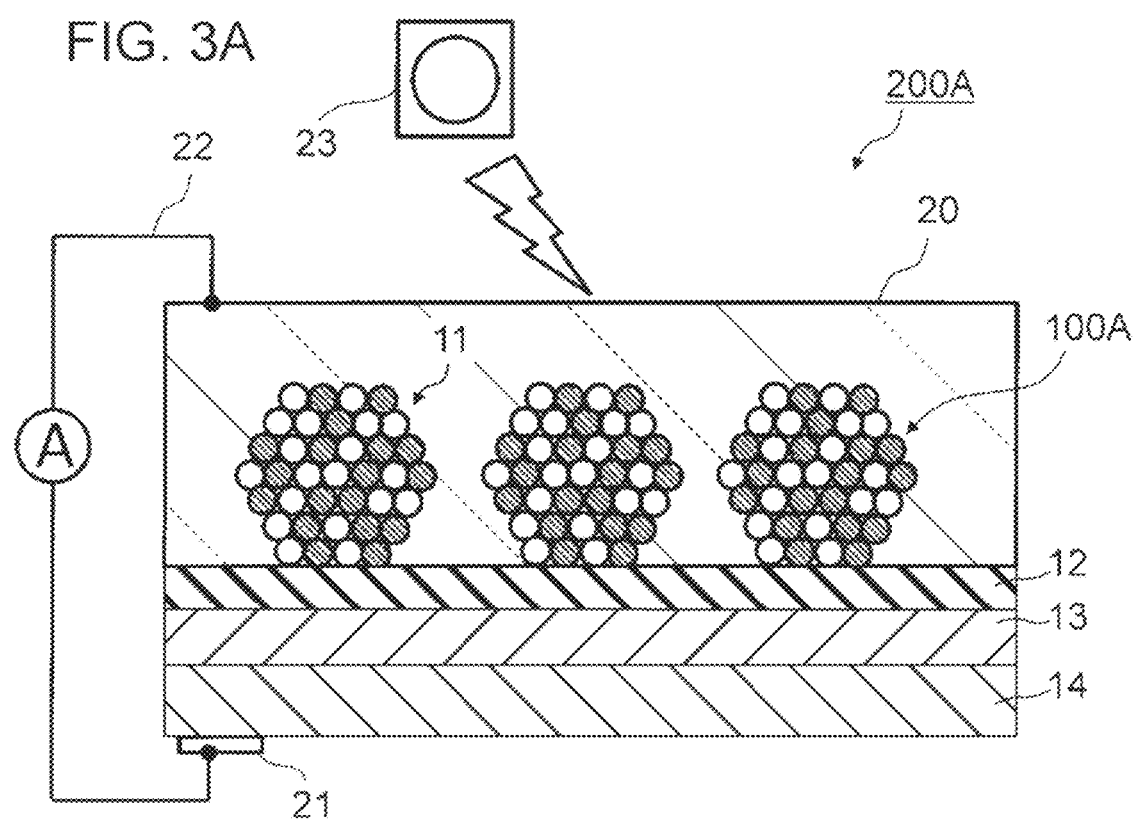
FIG. 3A is a schematic view of the configuration of a photoelectric converter including the Schottky device shown in FIG. 1A.

In an example shown in FIG. 1E, the metal film 19 plays a role as a circuit. Unlike the configuration shown in FIG. 1A, a transparent conductive film described below with reference to FIG. 3A is unnecessary. Therefore, a process for manufacturing a photoelectric conversion device can be simplified.

Figure 1F:
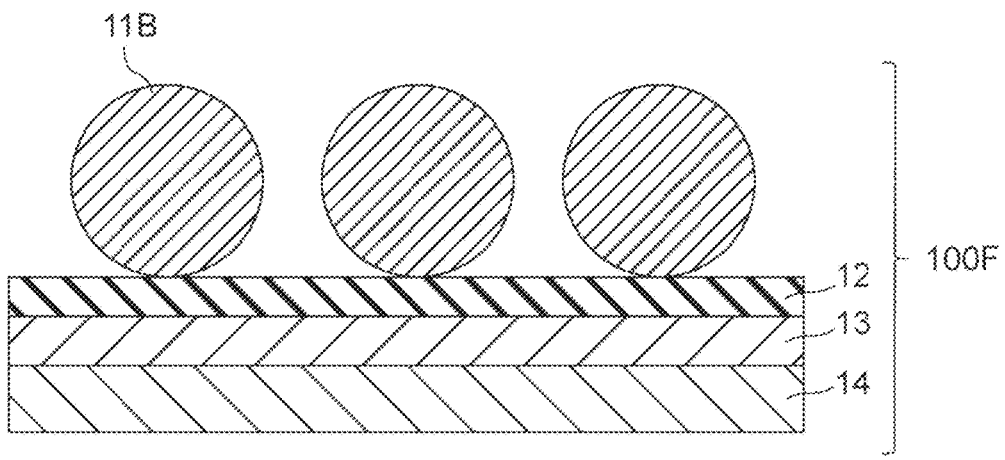
FIG. 1F is a schematic view of a Schottky device according to still another modification.

FIG. 1F is a schematic view of a Schottky device 100F according to still another modification of this embodiment. In this modification, the Schottky device 100F differs from the configuration shown in FIG. 1A in that nanostructure bodies 11B made of a metal nitride are arranged on an oxide layer 12 instead of alloy nanoparticles. In an example shown in FIG. 1F, the efficiency of plasmon absorption for light in a visible long-wavelength region to the near-infrared region is high and the photoelectric conversion efficiency can be enhanced. The nanostructure bodies 11B can be formed using, for example, at least one metal nitride selected from the group consisting of titanium nitride (TiN), zirconium nitride (ZrN), tantalum nitride (TaN), and hafnium nitride (HfN).

Figure 1G:
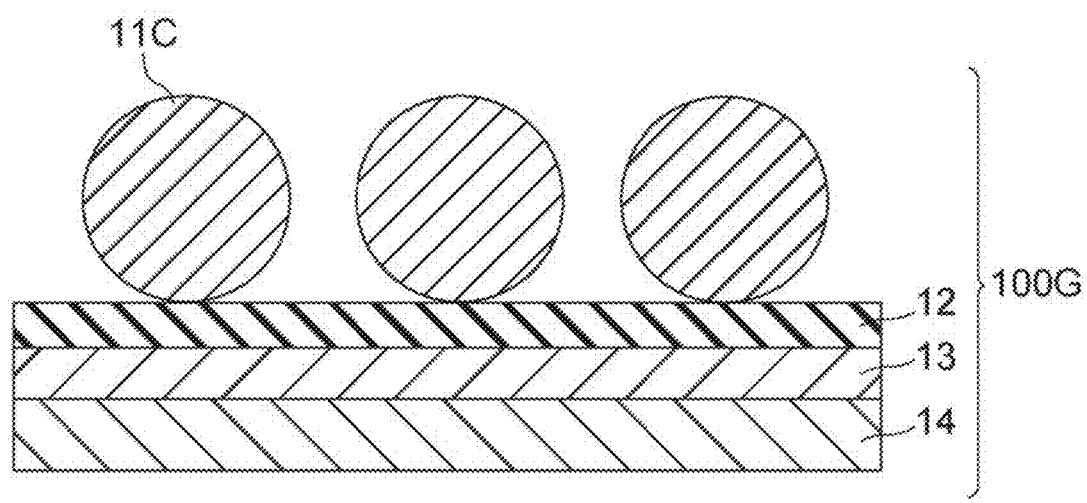
FIG. 1G is a schematic view of a Schottky device according to still another modification.

FIG. 1G is a schematic view of a Schottky device 100G according to still another modification of this embodiment. In this modification, the Schottky device 100G differs from the configuration shown in FIG. 1A in that nanostructure bodies 11C made of a conductive oxide are arranged on an oxide layer 12 instead of alloy nanoparticles. In an example shown in FIG. 1G, the efficiency of plasmon absorption for light in a longer wavelength near-infrared region is high and the photoelectric conversion efficiency can be enhanced. The nanostructure bodies 11C can be formed using, for example, at least one conductive oxide selected from the group consisting of tin-doped indium oxide (ITO), aluminium-doped zinc oxide (AZO), and gallium-doped zinc oxide (GZO).

Figure 1H:
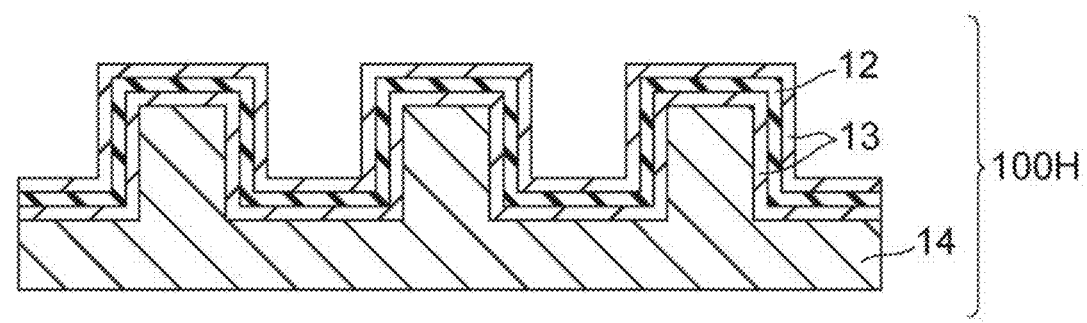
FIG. 1H is a schematic view of a Schottky device according to still another modification.

FIG. 1H is a schematic view of a Schottky device 100H according to still another modification of this embodiment. In this modification, the Schottky device 100H includes an n-type semiconductor 14 having a trench structure or a texture structure. An upper section of the n-type semiconductor 14 is covered by an alloy layer 13, an oxide layer 12, and an alloy layer 13. In this modification, a surface of the Schottky device 100H has a plurality of recesses or protrusions. The center-to-center distance between two neighboring recesses or protrusions may be on the order of nanometers, that is, greater than or equal to 1 nm and less than 1 μm. In such a structure, the alloy layer 13, which is the outermost layer, functions as a nanostructure body which induces surface plasmon resonance. According to a configuration shown in FIG. 1H, the efficiency of plasmon absorption is high due to a nanoantenna structure and the photoelectric conversion efficiency can be enhanced.

Figure 1I:
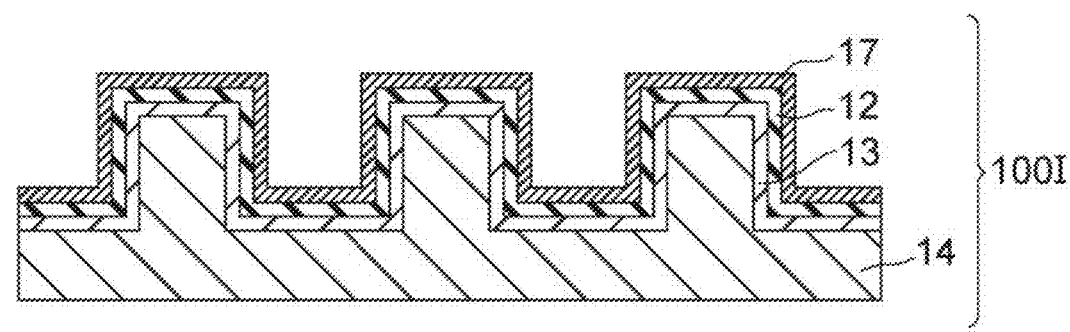
FIG. 1I is a schematic view of a Schottky device according to still another modification.

FIG. 1I is a schematic view of a Schottky device 100I according to still another modification of this embodiment. In this modification, the Schottky device 100I includes an n-type semiconductor 14 having a trench structure or a texture structure and an upper section of the n-type semiconductor 14 is covered by an alloy layer 13, an oxide layer 12, and an elemental-metal layer 17. In such a structure, the elemental-metal layer 17, which is the outermost layer, functions as a nanostructure body which induces surface plasmon resonance. According to a configuration shown in FIG. 1I, the efficiency of plasmon absorption is higher and the photoelectric conversion efficiency can be enhanced.

Figure 1J:
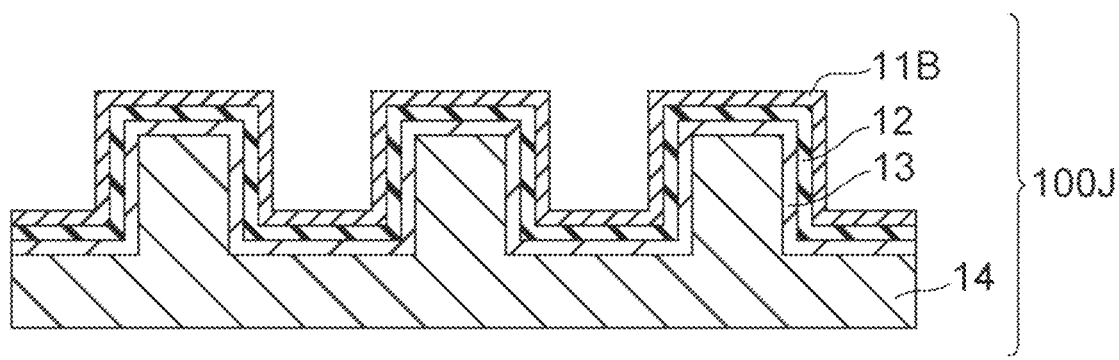
FIG. 1J is a schematic view of a Schottky device according to still another modification.

FIG. 1J is a schematic view of a Schottky device 100J according to still another modification of this embodiment. In this modification, the Schottky device 100J includes an n-type semiconductor 14 having a trench structure or a texture structure and an upper section of the n-type semiconductor 14 is covered by an alloy layer 13, an oxide layer 12, and a metal nitride layer 11B. In such a structure, the metal nitride layer 11B, which is the outermost layer, functions as a nanostructure body which induces surface plasmon resonance. According to a configuration shown in FIG. 1J, the efficiency of plasmon absorption for light in the visible long-wavelength region to the near-infrared region is high and the photoelectric conversion efficiency can be enhanced. The metal nitride layer 11B can be formed using, for example, at least one metal nitride selected from the group consisting of titanium nitride (TiN), zirconium nitride (ZrN), tantalum nitride (TaN), and hafnium nitride (HfN).

Figure 1K:
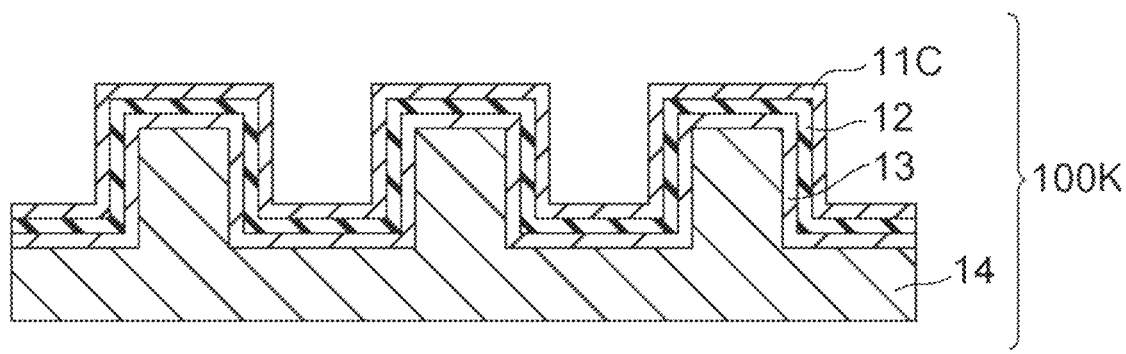
FIG. 1K is a schematic view of a Schottky device according to still another modification.

FIG. 1K is a schematic view of a Schottky device 100K according to still another modification of this embodiment. In this modification, the Schottky device 100K includes an n-type semiconductor 14 having a trench structure or a texture structure and an upper section of the n-type semiconductor 14 is covered by an alloy layer 13, an oxide layer 12, and a conductive oxide layer 11C. In such a structure, the conductive oxide layer 11C, which is the outermost layer, functions as a nanostructure body which induces surface plasmon resonance. According to a configuration shown in FIG. 1K, the efficiency of plasmon absorption for light in a longer-wavelength near-infrared region is high and the photoelectric conversion efficiency can be enhanced. The conductive oxide layer 11C can be formed using, for example, at least one conductive oxide selected from the group consisting of tin-doped indium oxide (ITO), aluminium-doped zinc oxide (AZO), and gallium-doped zinc oxide (GZO).

Next, examples of the arrangement of nanostructure bodies are described with reference to FIGS. 2A to 2C.

Figure 2A:
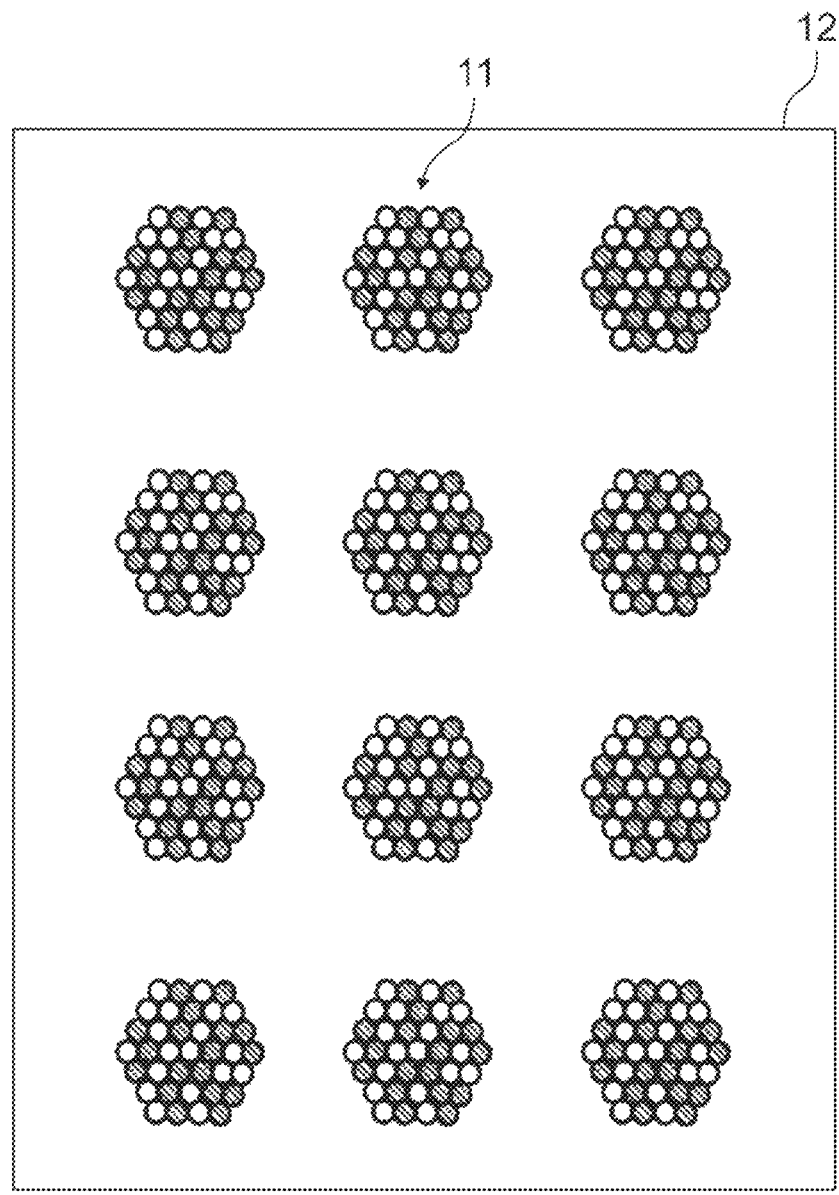
FIG. 2A is a top view of an example of the arrangement of a plurality of alloy nanoparticles in the Schottky device shown in FIG. 1A.

FIG. 2A is a top view of an example of the arrangement of the alloy nanoparticles 11 in the Schottky device 100A shown in FIG. 1A. As shown in this example, the alloy nanoparticles 11 may be two-dimensionally periodically arranged. The alloy nanoparticles 11 may be one-dimensionally arranged. The period of the array of the alloy nanoparticles 11 is not particularly limited. The period of the array of the alloy nanoparticles 11 may be set to, for example, a period about twice the size of the alloy nanoparticles 11.

Figure 2B:
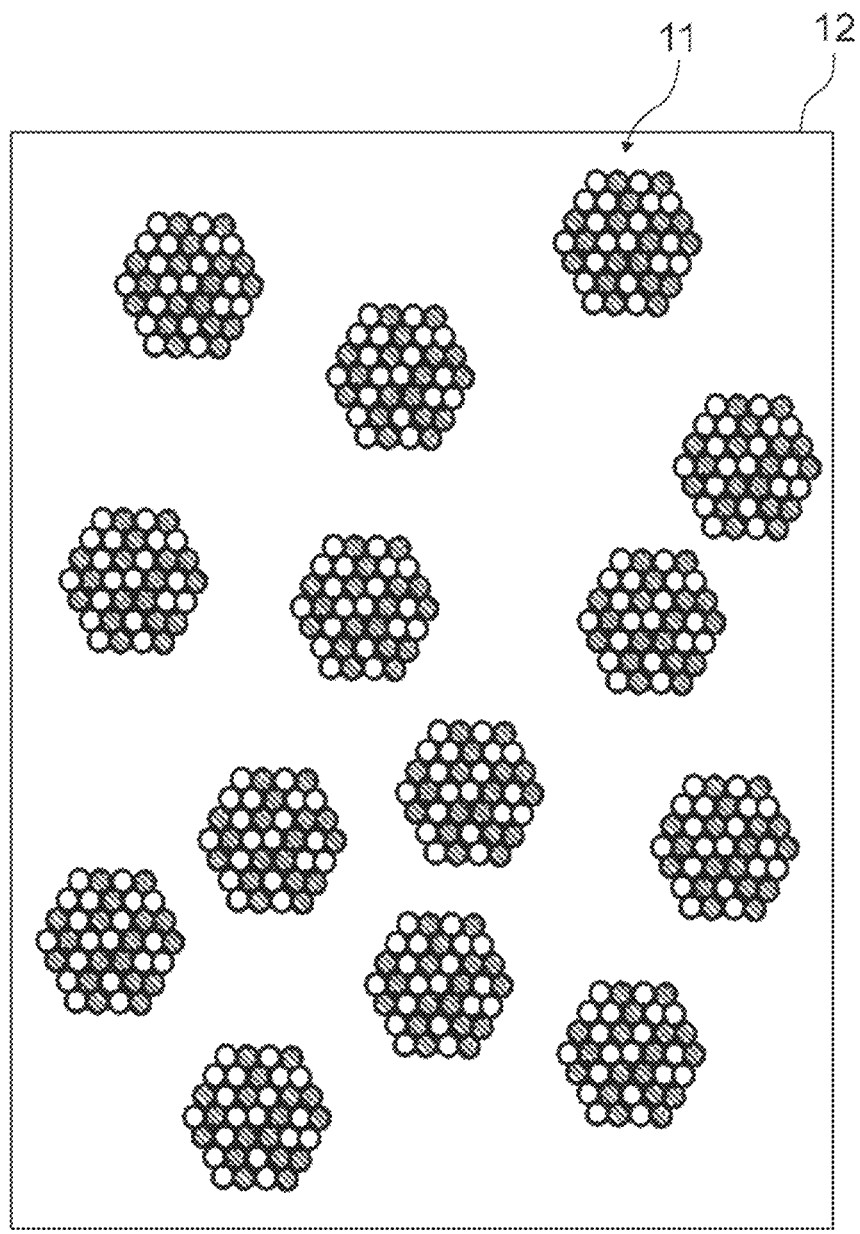
FIG. 2B is a top view of another example of the arrangement of the alloy nanoparticles in the Schottky device shown in FIG. 1A.

FIG. 2B is a top view of another example of the arrangement of the alloy nanoparticles 11 in the Schottky device 100A shown in FIG. 1A. In this example, the alloy nanoparticles 11 have no clear periodicity and are arranged at random or pseudo random. Even in this arrangement, an effect of this embodiment can be obtained without any problems.

Similarly in the configurations shown in FIGS. 1B to 1G besides FIG. 1A, the arrangements shown in FIGS. 2A and 2B may be used.

Incidentally, the structure of a plurality of nanoparticles need not be uniform and the nanoparticles may be different in size and shape from each other. Furthermore, even when a single nanoparticle only is disposed, an effect of this embodiment can be obtained.

In the structure shown in each of FIGS. 1H to 1K, the nanostructure body may have a one- or two-dimensional periodic structure or an aperiodic structure.

FIG. 2C is a top view of a Schottky device according to still another modification of this embodiment. In this modification, the Schottky device includes an alloy nanostructure body 11A having a comb-shaped structure. In this modification, the alloy nanostructure body 11A includes a plurality of sections 11Aa extending in one direction and a section 11Ab connecting end portions of the sections 11Aa. Each of the sections 11Aa, which extend in one direction, has a diameter on the order of nanometers and functions as a nanowire. This structure allows the sections 11Aa of the alloy nanostructure body 11A to be electrically connected to each other with the section 11Ab.

Figure 2D:
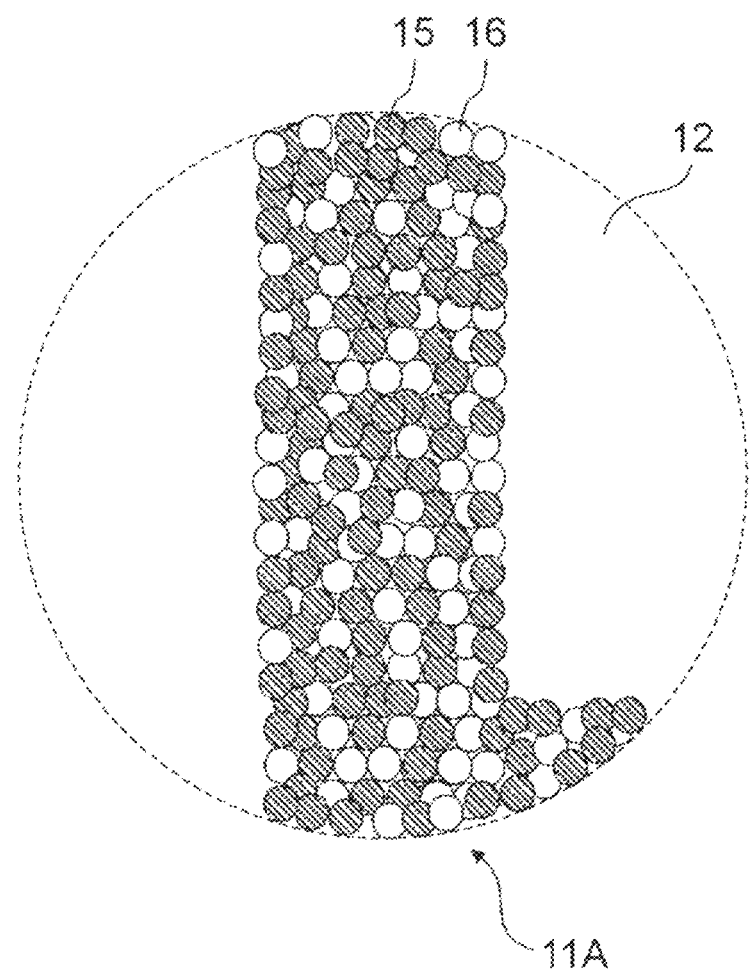
FIG. 2D is an enlarged view of a structure in a dashed line frame shown in FIG. 2C.

FIG. 2D is a schematic view of an example of the structure of a region surrounded by a dashed line circle shown in FIG. 2C. Referring to FIG. 2D, each of atoms of the first and second metals 15 and 16 is represented by a sphere. As shown in FIG. 2D, the alloy nanostructure body 11A is formed from the first metal 15 and the second metal 16. The alloy nanostructure body 11A may have a size larger than a nanometer scale as a whole. Even in this case, each nanowire section of the alloy nanostructure body 11A, which is comb-shaped, functions as an antenna and therefore an effect due to surface plasmon resonance can be obtained.

Figure 2E:
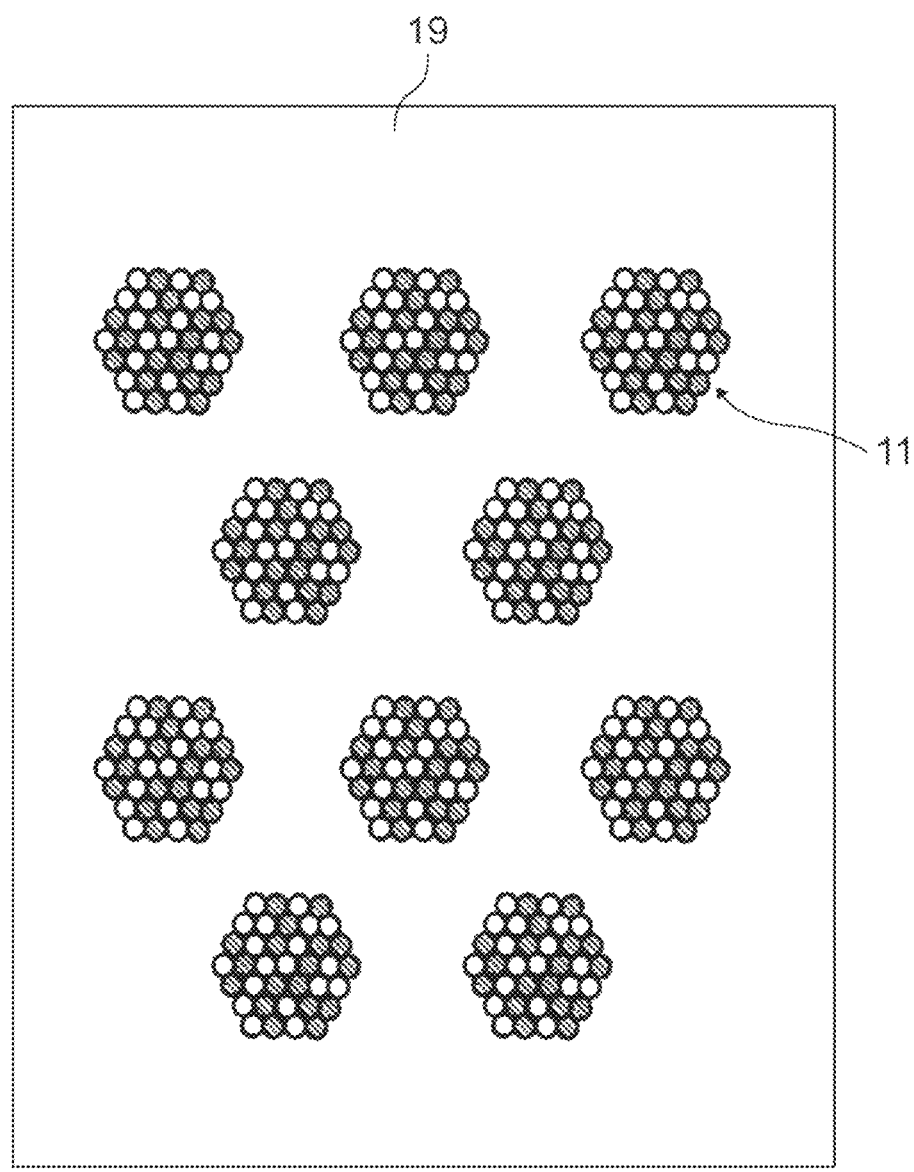
FIG. 2E is a top view of an example of the arrangement of a plurality of alloy nanoparticles in the Schottky device shown in FIG. 1E.

FIG. 2E is a top view of an example of the arrangement of the alloy nanoparticles 11 in the Schottky device 100E shown in FIG. 1E. The alloy nanoparticles 11 may be periodically arranged on the metal film 19 or may be aperiodically arranged thereon. Such elemental-metal nanoparticles as shown in FIG. 1B, such nanoparticles with a core-shell structure as shown in FIG. 1C or 1D, such nanoparticles made of a metal nitride as shown in FIG. 1F, or such nanoparticles made of a conductive oxide as shown in FIG. 1G may be arranged instead of the alloy nanoparticles 11. Alternatively, such a nanostructure body including a plurality of recesses and protrusions or a plurality of ridges and trenches as shown in FIGS. 1H to 1K or such a nanostructure body with a comb-shaped structure as shown in FIG. 2C may be disposed on the metal film 19.

Second Embodiment: Photoelectric Converter

Next, an embodiment of a photoelectric converter including a Schottky device is described.

FIG. 3A is a schematic view of the configuration of a photoelectric converter 200A including the Schottky device 100A shown in FIG. 1A. Irradiating the photoelectric converter 200A with light from a light source 23 generates a current.

The photoelectric converter 200A includes the Schottky device 100A, which is an optical device; an ohmic electrode 21 (also referred to as the first electrode) that is in contact with the n-type semiconductor 14 on the side opposite to the side on which the nanoparticles 11 are located; and a conductor 22 that electrically connects the ohmic electrode 21 and the nanoparticles 11. The photoelectric converter 200A further includes a transparent conductive film 20 disposed on a surface of the oxide layer 12 that is provided with the nanoparticles 11. The transparent conductive film 20 covers the nanoparticles 11. The transparent conductive film 20 is not in contact with the n-type semiconductor 14. The conductor 22 electrically connects the ohmic electrode 21 and the transparent conductive film 20.

The photoelectric converter 200A is prepared by forming the transparent conductive film 20, the ohmic electrode 21, and the conductor 22 on the Schottky device 100A. The n-type semiconductor 14 and the transparent conductive film 20 are electrically insulated by the oxide layer 12.

In the transparent conductive film 20, a material with high transmittance at the wavelength of light emitted from the light source 23 can be used. In particular, in the visible to near-infrared region, for example, tin-doped indium oxide (ITO), gallium-doped zinc oxide (GZO), aluminium-doped zinc oxide (AZO), or the like may be used. In the oxide layer 12, for example, silicon dioxide ($SiO_2$) may be used.

The light source 23 emits light toward the alloy nanoparticles 11 in the Schottky device 100A. An example of the light source 23 may be a laser, a xenon lamp, a mercury lamp, or a halogen lamp. The light source 23 emits light having an energy which is lower than or equal to the band gap energy of the n-type semiconductor 14 and which corresponds to the plasmon resonance wavelength of the alloy nanoparticles 11. The light source 23 may emit light in a relatively wide wavelength range. The wavelength range is determined so as to cover the surface plasmon resonance wavelength of the alloy nanoparticles 11, that is, the surface plasmon resonance wavelength of the first metal 15. The light source 23 may be a component of the photoelectric converter 200A or an element outside the photoelectric converter 200A. When the Schottky device 100A is irradiated with light from the light source 23, a current flows through the conductor 22.

According to the above configuration, the natural oxidation of a metal with a low work function can be suppressed and a Schottky barrier can be reduced at relatively low cost. As a result, a device which performs photoelectric conversion at higher efficiency can be achieved.

Figure 3B:
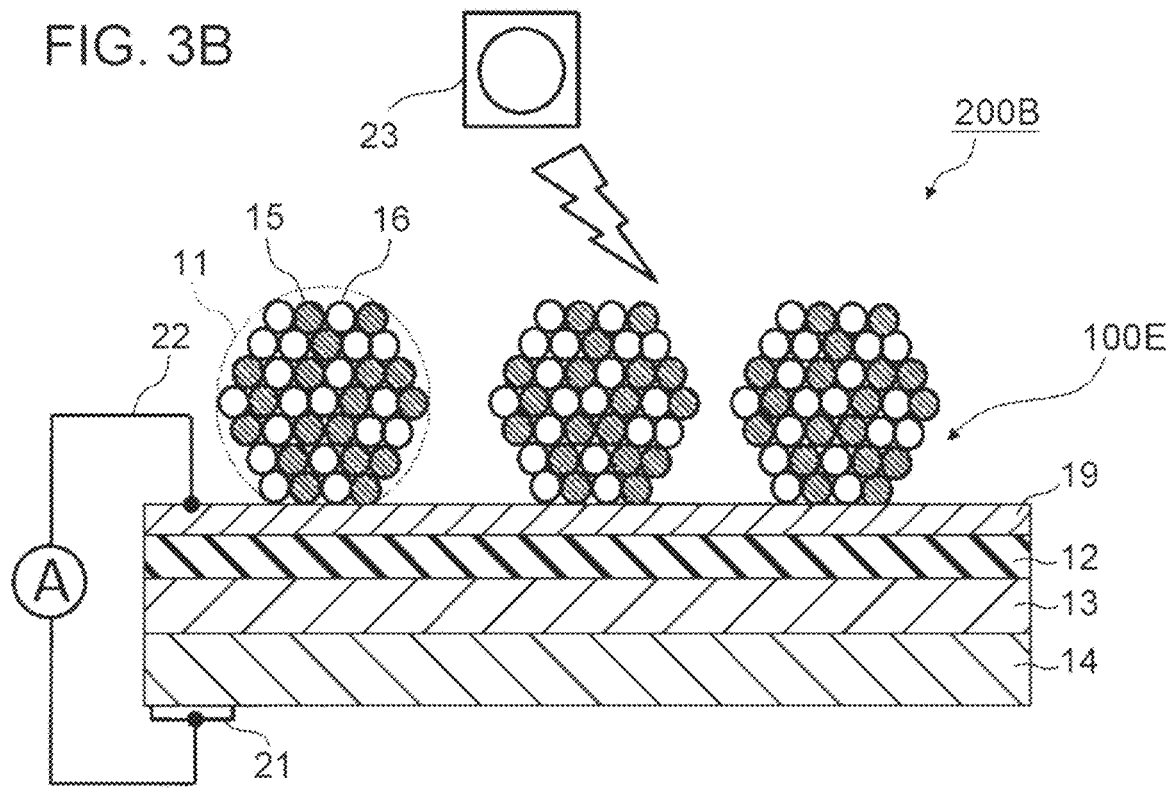
FIG. 3B is a schematic view of the configuration of a photoelectric converter including the Schottky device shown in FIG. 1E.

FIG. 3B is a schematic view of a photoelectric converter 200B according to a modification of the second embodiment. In this modification, the photoelectric converter 200B includes the Schottky device 100E shown in FIG. 1E. The photoelectric converter 200B includes no transparent conductive film 20 shown in FIG. 3A. A metal film 19 and an ohmic electrode 21 are electrically connected through a conductor 22. When the Schottky device 100E is irradiated with light from a light source 23, a current flows through the conductor 22.

According to the above configuration, the natural oxidation of a metal with a low work function can be suppressed and a Schottky barrier can be reduced at relatively low cost. As a result, a device which performs photoelectric conversion at higher efficiency can be achieved.

In examples shown in FIGS. 3A and 3B, a current is generated by irradiating the Schottky devices 100A and 100E with light. The generated current can be drawn outside through the conductor 22. The wavelength of usable light can be controlled in such a manner that the surface plasmon resonance wavelength is controlled by adjusting the structure of the alloy nanoparticles 11.

In this embodiment, an example including the Schottky device 100A shown in FIG. 1A and an example including the Schottky device 100E shown in FIG. 1E have been described. For example, a photoelectric converter including any one of the Schottky devices shown in FIGS. 1B to 1K and 2A to 2E may be composed without being limited to these configurations.

Third Embodiment: Fuel Generator

Next, an embodiment of a fuel generator including a Schottky device is described as another example of an optical device.

Figure 3C:
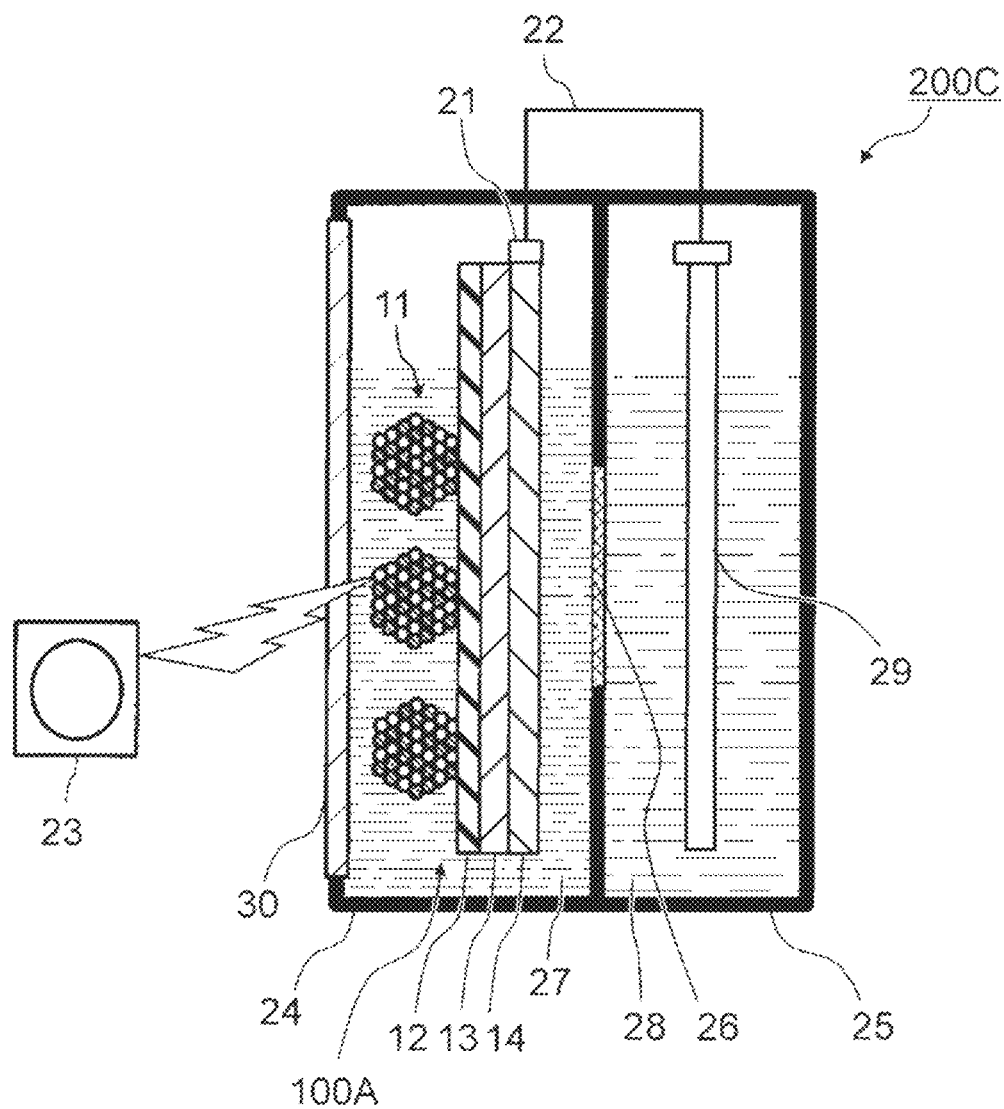
FIG. 3C is a schematic view of an example of a fuel generator including the Schottky device shown in FIG. 1A.

FIG. 3C is a schematic view of an example of a fuel generator 200C including the Schottky device 100A shown in FIG. 1A. When the fuel generator 200C is irradiated with light from a light source 23, the fuel generator 200C performs photoelectric conversion and, furthermore, generates fuel by a photochemical reaction. The fuel generator 200C includes an oxidation reaction tank 24, a reduction reaction tank 25, a proton-permeable membrane 26, the Schottky device 100A, a reduction electrode 29, an ohmic electrode 21, a conductor 22, and a quartz glass window 30. A first electrolytic solution 27 is held in the oxidation reaction tank 24. A second electrolytic solution 28 is held in the reduction reaction tank 25. The oxidation reaction tank 24 and the reduction reaction tank 25 are separated by the proton-permeable membrane 26. The Schottky device 100A is at least partly immersed in the first electrolytic solution 27. The reduction electrode 29 is at least partly immersed in the second electrolytic solution 28. An end portion of the n-type semiconductor 14 is provided with the ohmic electrode 21 (also referred to as the first electrode). The first electrode 21 is electrically connected to the reduction electrode 29 (also referred to as the second electrode) through the conductor 22.

An example of the first electrolytic solution 27 in the oxidation reaction tank 24 is an aqueous solution containing at least one selected from the group consisting of potassium hydrogen carbonate ($KHCO_3$), sodium hydrogen carbonate ($NaHCO_3$), potassium hydroxide (KOH), and sodium hydroxide (NaOH). The concentration of an electrolyte in the first electrolytic solution 27 may be set to, for example, 0.1 mol/L or more. The first electrolytic solution 27 may be, for example, basic. The second electrolytic solution 28 in the reduction reaction tank 25 may be an electrolytic solution generally used. The second electrolytic solution 28 used may be, for example, an aqueous solution containing at least one selected from the group consisting of potassium hydrogen carbonate ($KHCO_3$), sodium hydrogen carbonate ($NaHCO_3$), potassium chloride (KCl), and sodium chloride (NaCl). When the second electrolytic solution 28 contains any electrolyte, the concentration of the electrolyte in the second electrolytic solution 28 may be set to, for example, 0.1 mol/L or more. The second electrolytic solution 28 may be, for example, acidic.

The quartz glass window 30 is disposed in a side surface of the oxidation reaction tank 24. A region of the Schottky device 100A that is located on the light irradiation side of the Schottky device 100A and that is immersed in the first electrolytic solution 27 is irradiated with light from the light source 23 through the quartz glass window 30. The proton-permeable membrane 26 is interposed between the oxidation reaction tank 24 and the reduction reaction tank 25 and therefore the first electrolytic solution 27 and the second electrolytic solution 28 are not mixed with each other. The structure of the proton-permeable membrane 26 is not particularly limited and may be one through which protons ($H^+$) pass and in which the passage of other substances is inhibited. A specific example of the proton-permeable membrane 26 is a Nafion® membrane.

The first electrode 21 may be made of, for example, platinum, an alloy containing platinum, or a platinum compound. When light with an energy corresponding to the surface plasmon resonance wavelength of the first metal 15 is incident on the nanoparticles 11, hydrogen is generated on the second electrode 29.

According to the above configuration, the natural oxidation of a metal with a low work function can be suppressed and a Schottky barrier can be reduced at relatively low cost. Therefore, a device capable of performing photoelectric conversion and fuel generation at higher efficiency can be achieved.

In an example shown in FIG. 3C, the reduction electrode 29 is appropriately placed in the reduction reaction tank 25 and the Schottky device 100A is irradiated with light, whereby fuel is generated. As a result, for example, hydrogen ($H_2$) or the like can be generated in the form of a reduction product. The type of product can be changed by selecting the type of material of the catalyst layer used.

In this embodiment, the fuel generator 200C may include any one of the Schottky devices shown in FIGS. 1B to 1K and 2A to 2E instead of the Schottky device 100A shown in FIG. 1A.

Example

Figure 4A:
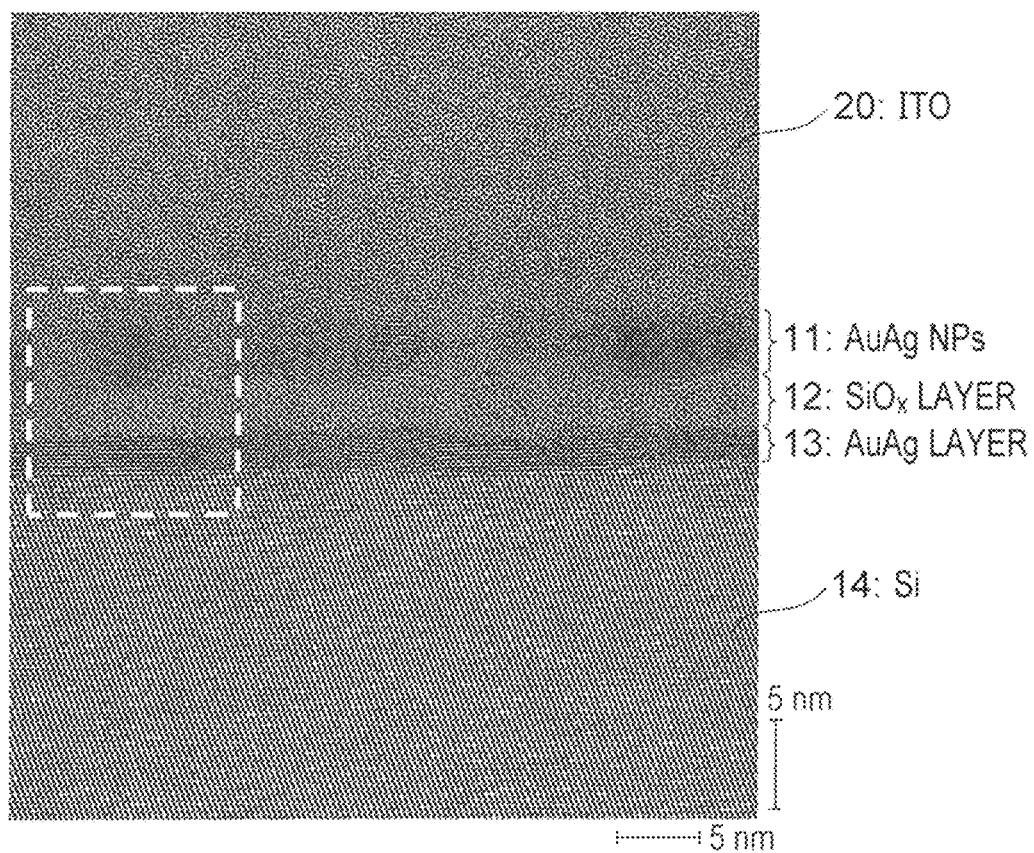
FIG. 4A is a TEM image of a cross section of an optical device in an example.
Figure 4B:
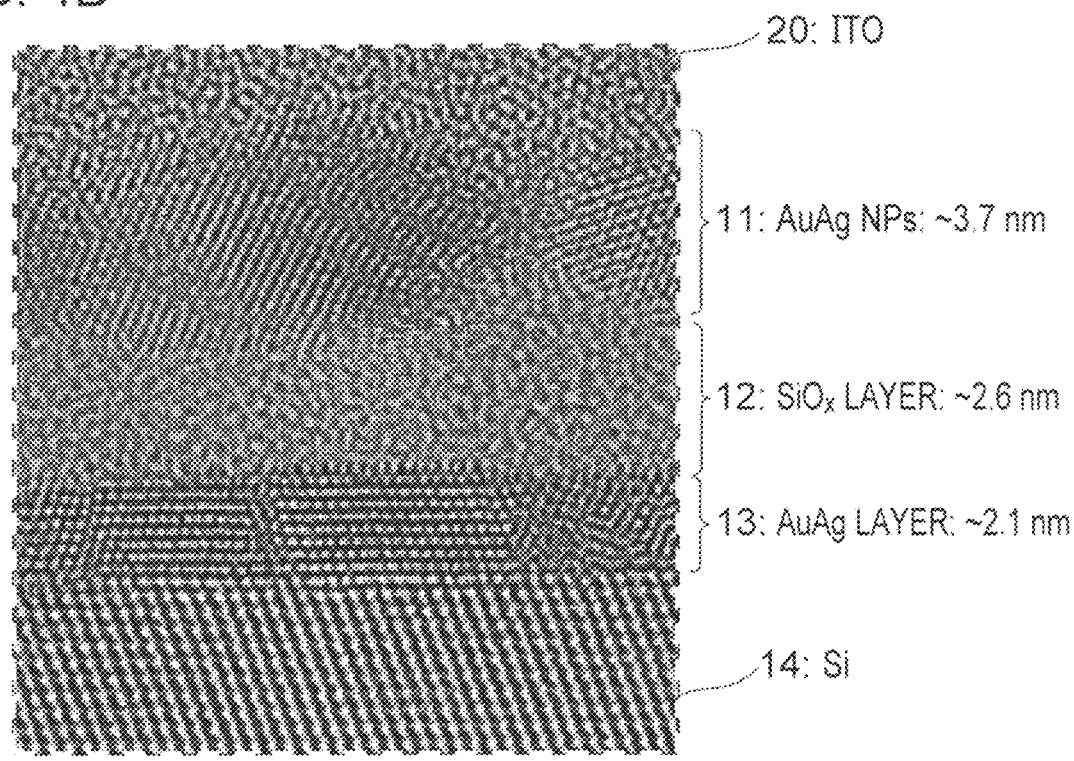
FIG. 4B is an enlarged view of a region surrounded by a dashed line frame shown in FIG. 4A.

Next, an example of the present disclosure is described.
FIG. 4A is a TEM image of an example of a cross section of an actually prepared optical device. FIG. 4B is an enlarged view of a region surrounded by a dashed line frame shown in FIG. 4A. In this example, alloy nanoparticles 11 (NPs) of Au and Ag were formed on a Si substrate functioning as an n-type semiconductor 14 by an arc plasma method using an alloy of gold (Au) and silver (Ag) as a target material. An alloy layer 13 of Au and Ag and an oxide layer 12 of silicon oxide were also formed by this method. After the alloy nanoparticles 11 were formed, a transparent conductive film 20 was formed using ITO.

Figure 5:
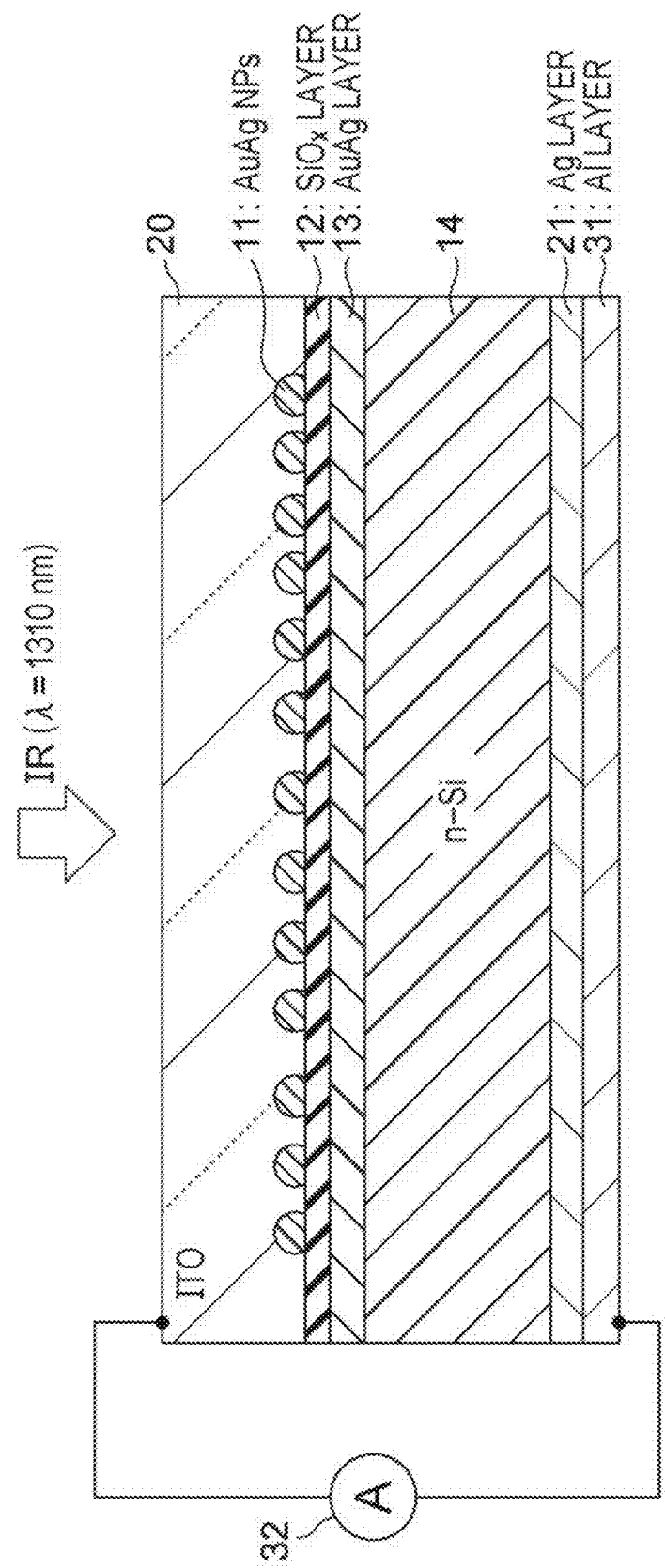
FIG. 5 is a schematic view of the configuration of a photoelectric converter in an example and is an illustration showing another shape of an alloy.

The inventors prepared a photoelectric converter using the optical device of this example and performed an experiment to investigate photoresponse characteristics thereof. FIG. 5 is a schematic view of the configuration of the photoelectric converter. The photoelectric converter included an ohmic electrode 21 made of Ag and a passivation layer 31 made of Al in addition to the n-type semiconductor 14, the alloy layer 13, the oxide layer 12, the alloy nanoparticles 11, and the transparent conductive film 20. The ohmic electrode 21 and the passivation layer 31 were formed in sequence on a surface of the Si substrate, which was the n-type semiconductor 14, the surface being opposite to the side on which the alloy layer 13 was located. The sensitivity of the photoelectric converter was measured by irradiating the transparent conductive film 20 side with a near-infrared laser beam with a wavelength $\lambda$ of 1,310 nm and measuring the current flowing through a circuit using an ammeter 32.

For comparison, the sensitivity of an optical device prepared by the same method as above except that an elemental metal, Au, was used as a target material instead of an alloy of Au and Ag was measured in the same manner as above. Measurement results are shown in Table 1.

TABLE 1

|  | Au | Alloy ($Au_4Ag_6$) |
|---|---|---|
| Sensitivity | 2.5 mA/W | 7.2 mA/W |

Herein, the sensitivity represents a value obtained by dividing the current (unit: mA) flowing through a circuit when light is applied by the intensity (unit: W) of the applied light. As shown in Table 1, about three times the sensitivity obtained in the case of an elemental metal, Au, was obtained in the case of using an alloy (in this example, $Au_4Ag_6$). From this result, it was clear that using a nanostructure body made of an alloy enhances the sensitivity to enhance the photoelectric conversion efficiency.

Incidentally, even in a configuration in which a nanostructure body made of an elemental metal such as Au, a metal nitride, or a conductive oxide is used, an effect of enhancing the photoelectric conversion efficiency due to the oxide layer 12 and the alloy layer 13 can be obtained as described above. Thus, the present disclosure is not limited to a configuration in which alloy nanoparticles are used as nanostructure bodies.

As described above, an optical device according to an embodiment of the present disclosure includes a nanostructure body which induces surface plasmon resonance when irradiated with light, an oxide layer which is in contact with the nanostructure body, an alloy layer which is in contact with the oxide layer and which is made of an alloy containing a first metal and a second metal that are different in work function from each other, and an n-type semiconductor which is in Schottky contact with the alloy layer.

According to the above configuration, the alloy layer, which has a low work function, can be disposed between the nanostructure body and the n-type semiconductor. Such a configuration enables a Schottky barrier to be reduced, enhances the transport efficiency of hot electrons generated from the nanostructure body, and enables the photoelectric conversion efficiency to be enhanced.

In an embodiment, the alloy layer has a lower work function than the nanostructure body.

According to this configuration, the alloy layer, which has a lower work function than the nanostructure body, can effectively reduce a Schottky barrier between the nanostructure body and the n-type semiconductor. Therefore, the transport efficiency of the hot electrons generated from the nanostructure body can be enhanced and the photoelectric conversion efficiency can be enhanced.

The nanostructure body may be made of at least one selected from the group consisting of the first metal alone, an intermetallic compound containing the first metal and the second metal, a solid-solution alloy containing the first metal and the second metal, conductive oxides, and metal nitrides.

For example, the nanostructure body may be made of at least one selected from the group consisting of the first metal alone, an intermetallic compound containing the first metal and the second metal, and a solid-solution alloy containing the first metal and the second metal. The work function of the second metal may be set to a value lower than the work function of the first metal.

According to this configuration, a metal with excellent plasmonic characteristics can be used as a first metal. This enhances plasmonic characteristics of the nanostructure body, thereby enabling the photoelectric conversion efficiency to be enhanced. Since the second metal, which has a relatively low work function, is contained in the alloy layer, a Schottky barrier can be reduced and the photoelectric conversion efficiency can be enhanced.

The nanostructure body may contain at least one metal nitride selected from the group consisting of titanium nitride (TiN), zirconium nitride (ZrN), tantalum nitride (TaN), and hafnium nitride (HfN).

According to this configuration, the efficiency of plasmon absorption for light in a visible long-wavelength region to the near-infrared region and the transport efficiency of hot electrons are high and the photoelectric conversion efficiency can be enhanced.

The nanostructure body may contain at least one conductive oxide selected from the group consisting of tin-doped indium oxide (ITO), aluminium-doped zinc oxide (AZO), and gallium-doped zinc oxide (GZO).

According to this configuration, the efficiency of plasmon absorption for light in a longer wavelength near-infrared region and the transport efficiency of hot electrons are high and the photoelectric conversion efficiency can be enhanced.

The first metal may be at least one metal selected from the group consisting of gold (Au), silver (Ag), copper (Cu), palladium (Pd), and aluminium (Al). The second metal may be at least one metal selected from the group consisting of titanium (Ti), chromium (Cr), silver (Ag), copper (Cu), aluminium (Al), nickel (Ni), manganese (Mn), iron (Fe), zinc (Zn), gallium (Ga), and tantalum (Ta).

According to this configuration, a metal with excellent plasmonic characteristics is used as a first metal and therefore plasmonic characteristics of the nanostructure body can be enhanced. A metal with a relatively low work function is used as a second metal; hence, a Schottky barrier can be reduced and the photoelectric conversion efficiency can be enhanced.

The n-type semiconductor may be an inorganic semiconductor.

The nanostructure body may have a comb-shaped structure.

The nanostructure body may include at least one nanoparticle. The particle diameter of the at least one nanoparticle may be greater than or equal to 1 nm and less than or equal to 200 nm.

The at least one nanoparticle may include a plurality of nanoparticles. The optical device may further include a metal film that electrically connects the nanoparticles to each other.

According to this configuration, the nanoparticles are provided and therefore the photoelectric conversion efficiency can be further enhanced.

The at least one nanoparticle may include an intermetallic compound or solid-solution alloy containing the first metal and the second metal or the first metal alone and a cavity surrounded by the intermetallic compound, the solid-solution alloy, or the first metal alone.

According to this configuration, the surface plasmon resonance wavelength can be shifted to a longer wavelength by the interaction between an inner shell (that is, a cavity) and surface plasmon in an outer shell (that is, an elemental metal or an alloy).

The at least one nanoparticle may include a core section containing at least one selected from the group consisting of gold (Au), silver (Ag), copper (Cu), palladium (Pd), aluminium (Al), polymer materials, and silica and a shell section which is made of an intermetallic compound or solid-solution alloy containing the first metal and the second metal or the first metal alone and which at least partly covers the core section.

When the core section contains a polymer material or silica, the surface plasmon resonance wavelength can be shifted to a longer wavelength by the interaction between an inner shell (that is, the core section) and surface plasmon in an outer shell (that is, the shell section). When the core section contains gold, silver, copper, or aluminium, plasmonic characteristics of the nanoparticle can be further enhanced.

The core section may consist essentially of gold (Au), silver (Ag), copper (Cu), aluminium (Al), palladium (Pd), a polymer material, or silica.

In each nanoparticle, the shell section may cover the whole of the core section.

The optical device may further include a light source that emits light having an energy which is lower than or equal to the band gap energy of the n-type semiconductor and which corresponds to the surface plasmon resonance wavelength of the at least one nanoparticle.

The n-type semiconductor may include at least one selected from the group consisting of silicon semiconductors, germanium semiconductors, and gallium arsenide semiconductors. The surface plasmon resonance wavelength of the at least one nanoparticle may be greater than or equal to 900 nm.

The n-type semiconductor may include at least one selected from the group consisting of titanium oxide ($TiO_2$) semiconductors, gallium nitride (GaN) semiconductors, and strontium titanate ($SrTiO_3$) semiconductors. The surface plasmon resonance wavelength of the at least one nanoparticle may be greater than or equal to 400 nm.

A photoelectric converter according to an embodiment of the present disclosure includes the above-mentioned optical device, an electrode, and a conductor that electrically connects the electrode and the nanostructure body. The n-type semiconductor has a first surface that is in contact with the alloy layer and a second surface that is opposite to the first surface. The electrode is in contact with the second surface of the n-type semiconductor.

The photoelectric converter may further include a transparent conductive film that covers the nanostructure body. The transparent conductive film need not be in contact with the n-type semiconductor. The conductor may electrically connect the electrode and the transparent conductive film.

The optical device may further include a metal film between the nanostructure body and the oxide layer. The conductor may electrically connect the electrode and the metal film.

A fuel generator according to an embodiment of the present disclosure includes the above-mentioned optical device, a first electrode that is in contact with the n-type semiconductor in the optical device, an oxidation reaction tank that contains a first electrolytic solution and the optical device, a reduction reaction tank that contains a second electrolytic solution and a second electrode, a proton-permeable membrane that is located at the boundary between the oxidation reaction tank and the reduction reaction tank, and a conductor that connects the first electrode and the second electrode. The optical device is in contact with the first electrolytic solution. The second electrode is in contact with the second electrolytic solution.

The first electrode may be made of platinum, an alloy containing platinum, or a platinum compound. When light with an energy corresponding to the surface plasmon resonance wavelength of the first metal is incident on the intermetallic compound or solid-solution alloy in the optical device, hydrogen may be generated on the second electrode.

According to this configuration, hydrogen can be obtained by water splitting using the first electrode which contains platinum.

The first electrolytic solution may be an aqueous solution containing at least one selected from the group consisting of potassium hydrogen carbonate ($KHCO_3$), sodium hydrogen carbonate ($NaHCO_3$), potassium hydroxide (KOH), and sodium hydroxide (NaOH).

The second electrolytic solution may be an aqueous solution containing at least one selected from the group consisting of potassium hydrogen carbonate ($KHCO_3$), sodium hydrogen carbonate ($NaHCO_3$), potassium chloride (KCl), and sodium chloride (NaCl).

A technique of the present disclosure can be used for any application in which photoelectric conversion is performed. The technique can be used for, for example, photodetectors such as image sensors, fuel generators, and the like.

What is claimed is:

1. A photoelectric converter comprising:
   a nanostructure body which induces surface plasmon resonance when irradiated with light;
   an oxide layer which is in contact with the nanostructure body and made of an insulating material;
   an alloy layer which is in contact with the oxide layer and which comprises an alloy containing a first metal and a second metal that are different in work function from each other;
   an n-type semiconductor which is in Schottky contact with the alloy layer;
   an electrode; and
   a conductor that electrically connects the electrode and the nanostructure body,
   wherein the alloy layer is sandwiched between the oxide layer and the n-type semiconductor, and
   wherein the n-type semiconductor has a first surface that is in contact with the alloy layer and a second surface

19 that is opposite to the first surface, and the electrode is in contact with the second surface of the n-type semiconductor.

2. The photoelectric converter according to claim 1, wherein the alloy layer has a lower work function than the nanostructure body.

3. The photoelectric converter according to claim 1, wherein the nanostructure body comprises at least one selected from the group consisting of the first metal alone, an intermetallic compound containing the first metal and the second metal, a solid-solution alloy containing the first metal and the second metal, conductive oxides, and metal nitrides.

4. The photoelectric converter according to claim 1, wherein
the nanostructure body comprises at least one selected from the group consisting of the first metal alone, an intermetallic compound containing the first metal and the second metal, and a solid-solution alloy containing the first metal and the second metal, and
the second metal has a lower work function than the first metal.

5. The photoelectric converter according to claim 1, wherein the nanostructure body contains at least one conductive oxide selected from the group consisting of tin-doped indium oxide (ITO), aluminium-doped zinc oxide (AZO), and gallium-doped zinc oxide (GZO).

6. The photoelectric converter according to claim 1, wherein the nanostructure body contains at least one metal nitride selected from the group consisting of titanium nitride (TiN), zirconium nitride (ZrN), tantalum nitride (TaN), and hafnium nitride (HfN).

7. The photoelectric converter according to claim 1, wherein the n-type semiconductor is an inorganic semiconductor.

8. The photoelectric converter according to claim 1, wherein the nanostructure body has a comb-shaped structure.

9. The photoelectric converter according to claim 1, wherein
the nanostructure body includes at least one nanoparticle, and
a particle diameter of the at least one nanoparticle is greater than or equal to 1 nm and less than or equal to 200 nm.

10. The photoelectric converter according to claim 9, wherein the at least one nanoparticle comprises a plurality of nanoparticles,
the photoelectric converter further comprising a metal film that electrically connects the nanoparticles to each other.

11. The photoelectric converter according to claim 9, wherein the at least one nanoparticle includes:
an intermetallic compound or solid-solution alloy containing the first metal and the second metal or the first metal alone; and
a cavity surrounded by the intermetallic compound, the solid-solution alloy, or the first metal alone.

12. The photoelectric converter according to claim 10, wherein the at least one nanoparticle includes:
a core section containing at least one selected from the group consisting of gold (Au), silver (Ag), copper (Cu), palladium (Pd), aluminium (Al), polymer materials, and silica; and
a shell section which comprises an intermetallic compound or solid-solution alloy containing the first metal

20 and the second metal or the first metal alone and which at least partly covers the core section.

13. The photoelectric converter according to claim 12, wherein the core section consists essentially of gold (Au), silver (Ag), copper (Cu), aluminium (Al), palladium (Pd), a polymer material, or silica.

14. The photoelectric converter according to claim 12, wherein in each nanoparticle, the shell section covers the whole of the core section.

15. The photoelectric converter according to claim 9, further comprising a light source that emits light having an energy which is lower than or equal to a band gap energy of the n-type semiconductor and which corresponds to a surface plasmon resonance wavelength of the at least one nanoparticle.

16. The photoelectric converter according to claim 9, wherein
the n-type semiconductor includes at least one selected from the group consisting of silicon semiconductors, germanium semiconductors, and gallium arsenide semiconductors, and
a surface plasmon resonance wavelength of the at least one nanoparticle is greater than or equal to 900 nm.

17. The photoelectric converter according to claim 9, wherein
the n-type semiconductor includes at least one selected from the group consisting of titanium oxide ($TiO_2$) semiconductors, gallium nitride (GaN) semiconductors, and strontium titanate ($SrTiO_3$) semiconductors, and
a surface plasmon resonance wavelength of the at least one nanoparticle is greater than or equal to 400 nm.

18. The photoelectric converter according to claim 1, further comprising a transparent conductive film that covers the nanostructure body,
wherein the transparent conductive film is not in contact with the n-type semiconductor, and
the conductor electrically connects the electrode and the transparent conductive film.

19. The photoelectric converter according to claim 18, further includes a metal film between the nanostructure body and the oxide layer, and
the conductor electrically connects the electrode and the metal film.

20. A fuel generator comprising:
the photoelectric converter according to claim 1;
a first electrode that is in contact with the n-type semiconductor in the photoelectric converter;
an oxidation reaction tank that contains a first electrolytic solution and the photoelectric converter;
a reduction reaction tank that contains a second electrolytic solution and a second electrode;
a proton-permeable membrane that is located at a boundary between the oxidation reaction tank and the reduction reaction tank; and
a conductor that connects the first electrode and the second electrode,
wherein the photoelectric converter is in contact with the first electrolytic solution, and
the second electrode is in contact with the second electrolytic solution.

21. The fuel generator according to claim 20, wherein
the first electrode comprises platinum, an alloy containing platinum, or a platinum compound, and
when light with an energy corresponding to a surface plasmon resonance wavelength of the first metal is incident on the intermetallic compound or solid-solution alloy in the photoelectric converter, hydrogen is generated on the second electrode.

22. The fuel generator according to claim 20, wherein the first electrolytic solution is an aqueous solution containing at least one selected from the group consisting of potassium hydrogen carbonate ($KHCO_3$), sodium hydrogen carbonate ($NaHCO_3$), potassium hydroxide (KOH), and sodium hydroxide (NaOH).

23. The fuel generator according to claim 20, wherein the second electrolytic solution is an aqueous solution containing at least one selected from the group consisting of potassium hydrogen carbonate ($KHCO_3$), sodium hydrogen carbonate ($NaHCO_3$), potassium chloride (KCl), and sodium chloride (NaCl).

24. The photoelectric converter according to claim 1, wherein the alloy consists of metallic elements.

25. The photoelectric converter according to claim 1, wherein the alloy is a conductor.

26. The photoelectric converter according to claim 1, wherein the alloy layer is in direct contact with the oxide layer.

27. The photoelectric converter according to claim 1, wherein the nanostructure body and the alloy layer contain the same alloy.

28. The photoelectric converter according to claim 1, wherein the oxide layer is in contact with the n-type semiconductor.

* * * * *